(12) United States Patent
Wieland

(10) Patent No.: US 12,712,147 B2
(45) Date of Patent: Aug. 18, 2026

(54) CHARGED-PARTICLE OPTICAL DEVICE

(71) Applicant: ASML NETHERLANDS B.V., Veldhoven (NL)

(72) Inventor: Marco Jan-Jaco Wieland, Delft (NL)

(73) Assignee: ASML NETHERLANDS N.V., Veldhoven (NL)

( * ) Notice: Subject to any disclaimer, the term of this patent is extended or adjusted under 35 U.S.C. 154(b) by 342 days.

(21) Appl. No.: 18/580,269

(22) PCT Filed: Jul. 5, 2022

(86) PCT No.: PCT/EP2022/068633
§ 371 (c)(1),
(2) Date: Jan. 18, 2024

(87) PCT Pub. No.: WO2023/011824
PCT Pub. Date: Feb. 9, 2023

(65) Prior Publication Data

US 2024/0321547 A1 Sep. 26, 2024

(30) Foreign Application Priority Data

Aug. 2, 2021 (EP) .................................... 21189221

(51) Int. Cl.
*H01J 37/22* (2006.01)
*H01J 37/10* (2006.01)
(Continued)

(52) U.S. Cl.
CPC ............ *H01J 37/226* (2013.01); *H01J 37/10* (2013.01); *H01J 37/1474* (2013.01);
(Continued)

(58) Field of Classification Search
CPC ...... H01J 37/226; H01J 37/10; H01J 37/1474; H01J 37/244; H01J 37/3177;
(Continued)

(56) References Cited

U.S. PATENT DOCUMENTS

2007/0064213 A1 3/2007 Jager et al.
2007/0272856 A1 11/2007 Nijkerk et al.
(Continued)

FOREIGN PATENT DOCUMENTS

EP 1602121 12/2005
EP 2425444 3/2012
(Continued)

OTHER PUBLICATIONS

International Search Report and Written Opinion issued in corresponding PCT Patent Application No. PCT/EP2022/068633, dated Oct. 14, 2022.

(Continued)

*Primary Examiner* — Georgia Y Epps
*Assistant Examiner* — Hanway Chang
(74) *Attorney, Agent, or Firm* — Pillsbury Winthrop Shaw Pittman, LLP

(57) ABSTRACT

Charged-particle optical devices are disclosed. In one arrangement, a device includes a charged particle column and a light sensor. An objective lens array projects a plurality of beams towards a sample and has a plurality of electrodes arranged along a path of the plurality of beams. A plurality of scintillators receives signal particles emitted from the sample. Light is generated in response to the received signal particles. A light guiding arrangement guides light generated by the scintillators to the light sensor. The light guiding arrangement includes a mirror defining a plurality of apertures to allow passage of the plurality of beams through the mirror towards the sample.

20 Claims, 17 Drawing Sheets

(51) Int. Cl.
*H01J 37/147* (2006.01)
*H01J 37/244* (2006.01)
*H01J 37/317* (2006.01)

(52) U.S. Cl.
CPC ........ *H01J 37/244* (2013.01); *H01J 37/3177* (2013.01); *H01J 2237/0453* (2013.01); *H01J 2237/2443* (2013.01); *H01J 2237/24592* (2013.01)

(58) Field of Classification Search
CPC ....... H01J 2237/0453; H01J 2237/2443; H01J 2237/24592
See application file for complete search history.

(56) References Cited

U.S. PATENT DOCUMENTS

| | | | |
|---|---|---|---|
| 2015/0179399 | A1 | 6/2015 | Kruit et al. |
| 2017/0243717 | A1 | 8/2017 | Kruit |
| 2019/0255964 | A1 | 8/2019 | Berger et al. |
| 2019/0259564 | A1 | 8/2019 | Kruit et al. |
| 2019/0259570 | A1 | 8/2019 | Kruit et al. |
| 2020/0411274 | A1 | 12/2020 | Zeidler et al. |
| 2021/0210309 | A1 | 7/2021 | Wieland |
| 2021/0280386 | A1 | 9/2021 | Brodie et al. |

FOREIGN PATENT DOCUMENTS

| | | |
|---|---|---|
| EP | 2702595 | 3/2014 |
| EP | 2715768 | 4/2014 |
| EP | 3579263 | 12/2019 |
| EP | 3863040 | 8/2021 |
| EP | 3893263 | 10/2021 |
| EP | 3893264 | 10/2021 |
| EP | 4086933 | 11/2022 |
| EP | 4244881 | 9/2023 |
| EP | 4260357 | 10/2023 |
| TW | 201941244 | 10/2019 |
| WO | 2021/078352 | 4/2021 |
| WO | 2021/141488 | 7/2021 |

OTHER PUBLICATIONS

W. Bogaerts et al., “Compact Single-Mode Silicon Hybrid Rib/Strip Waveguide With Adiabatic Bends”, IEEE Photonics Society, vol. 3, No. 3, pp. 422-432 (2011).

452
451
403
301
208

403
411
301
302
208
414
416
417
410
411
418
211,212,213
411
420
412
422

438
436
436
436
410
432
432
432
430
403
438
438
434
436
436
436
410
432
432
432
438
434
208

440

-1 +1 -2 +2 -3 +3 -4 +4 -5 +5 V 442-1

442-m 442-2

441-n 441-3

441

441-2

442

211

441-1

2 4 6 8 9 ΔV

CHARGED-PARTICLE OPTICAL DEVICE

CROSS-REFERENCE TO RELATED APPLICATIONS

This application is the U.S. national phase entry of PCT Patent Application No. PCT/EP2022/068633 which was filed on Jul. 5, 2022, which claims priority of European Patent Application No. 21189221.1 which was filed on 2 Aug. 2, 2021 and which is incorporated herein in its entirety by reference.

FIELD

The present disclosure relates to a device for projecting a plurality of beams of charged particles to a sample and detecting signal particles emitted from the sample.

BACKGROUND

When manufacturing semiconductor integrated circuit (IC) chips, undesired pattern defects, as a consequence of, for example, optical effects and incidental particles, inevitably occur on a substrate (i.e. wafer) or a mask during the fabrication processes, thereby reducing the yield. Monitoring the extent of the undesired pattern defects is therefore an important process in the manufacture of IC chips. More generally, the inspection and/or measurement of a surface of a substrate, or other object/material, is an important process during and/or after its manufacture.

Pattern inspection tools with a charged particle beam have been used to inspect objects, which may be referred to as samples, for example to detect pattern defects. These tools typically use electron microscopy techniques, such as a scanning electron microscope (SEM). In a SEM, a primary electron beam of electrons at a relatively high energy is targeted with a final deceleration step in order to land on a sample at a relatively low landing energy. The beam of electrons is focused as a probing spot on the sample. The interactions between the material structure at the probing spot and the landing electrons from the beam of electrons cause signal electrons to be emitted from the surface, such as secondary electrons, backscattered electrons or Auger electrons. The signal electrons may be emitted from the material structure of the sample. By scanning the primary electron beam as the probing spot over the sample surface, signal electrons can be emitted across the surface of the sample. By collecting these emitted signal electrons from the sample surface, a pattern inspection tool may obtain an image representing characteristics of the material structure of the surface of the sample.

Throughput can be increased by using multiple charged particle beams in parallel. Collection of signal electrons in such multi-beam systems is challenging, particularly where a large number of beams are used and/or where the beams need to be closely spaced at the sample.

SUMMARY

It is an object of the present disclosure to improve collection of signal electrons in multi-beam systems.

According to an aspect of the invention, there is provided a charged-particle optical device configured to project a plurality of beams of charged particles to a sample, the device comprising a charged particle column and a light sensor, the charged particle column comprising: an objective lens array configured to project the plurality of beams towards the sample and comprising a plurality of electrodes arranged along a path of the plurality of beams; a plurality of scintillators configured to receive signal particles emitted from the sample and to generate light in response to the received signal particles; and a light guiding arrangement, wherein the light sensor is configured to detect the light generated by the scintillators and the light guiding arrangement is configured to guide the light generated by the scintillators to the light sensor, the light guiding arrangement comprising a mirror defining a plurality of apertures to allow/for passage of the plurality of beams through the mirror towards the sample.

According to an aspect of the invention, there is provided a charged-particle optical device configured to project a plurality of beams of charged particles to a sample, the device comprising: an objective lens array configured to project the plurality of beams towards the sample and comprising a plurality of electrodes arranged along a path of the plurality of beams; a detector comprising detector elements configured to receive signal particles emitted from the sample; and a Wien filter array configured to apply a deflection force to deflect signal particles towards the detector elements, each Wien filter element of the Wien filter array being configured to act on signal particles generated by a different respective group of the beams, wherein each group of beams comprises a row of the beams, the row extending perpendicularly or obliquely to a direction of the deflection force.

According to an aspect of the invention, there is provided a charged-particle optical device configured to project a plurality of beams of charged particles to a sample, the device comprising: an aperture array configured to generate the plurality of beams from a source beam incident on the aperture array; a collimator configured to collimate paths of the beams; an objective lens array configured to project the beams onto the sample and comprising a plurality of electrodes arranged along a path of the plurality of beams; a detector comprising detector elements configured to receive signal particles emitted from the sample; a Wien filter arrangement configured to deflect signal particles towards the detector elements; and one or more corrector arrays configured to improve alignment of the beams with the objective lens array and/or collimator.

BRIEF DESCRIPTION OF FIGURES

The above and other aspects of the present disclosure will become more apparent from the description of exemplary embodiments, taken in conjunction with the accompanying drawings.

DETAILED DESCRIPTION

Figure 1:
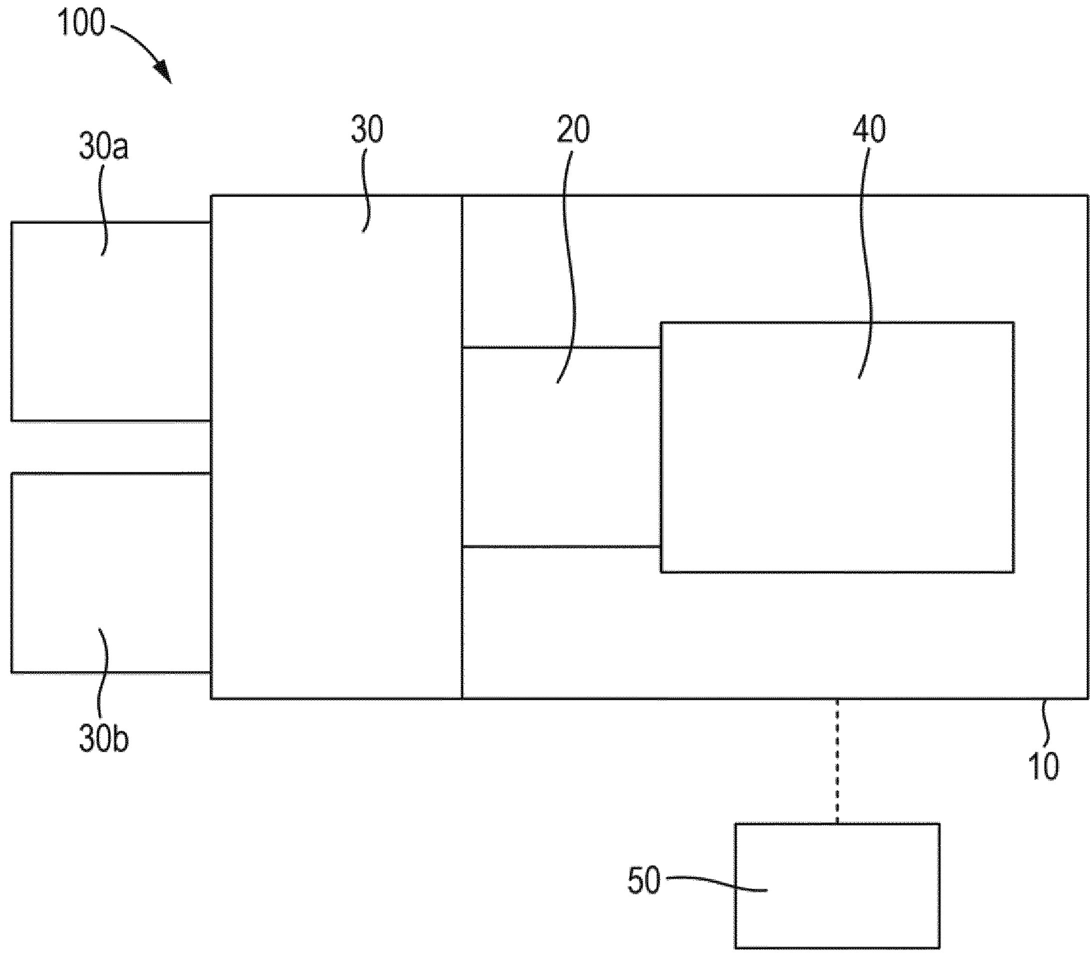
FIG. 1 is a schematic diagram illustrating an exemplary charged particle beam inspection apparatus.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The enhanced computing power of electronic devices, which reduces the physical size of the devices, can be accomplished by significantly increasing the packing density of circuit components such as transistors, capacitors, diodes, etc. on an IC chip. This has been enabled by increased resolution enabling yet smaller structures to be made. For example, an IC chip of a smart phone, which is the size of a thumbnail and available in, or earlier than, 2019, may include over 2 billion transistors, the size of each transistor being less than $1/1000^{th}$ of a human hair. Thus, it is not surprising that semiconductor IC manufacturing is a complex and time-consuming process, with hundreds of individual steps. Errors in even one step have the potential to dramatically affect the functioning of the final product. Just one "killer defect" can cause device failure. The goal of the manufacturing process is to improve the overall yield of the process. For example, to obtain a 75% yield for a 50-step process (where a step can indicate the number of layers formed on a wafer), each individual step must have a yield greater than 99.4%. If each individual step had a yield of 95%, the overall process yield would be as low as 7%.

While high process yield is desirable in an IC chip manufacturing facility, maintaining a high substrate (i.e. wafer) throughput, defined as the number of substrates processed per hour, is also essential. High process yield and high substrate throughput can be impacted by the presence of a defect. This is especially true if operator intervention is required for reviewing the defects. Thus, high throughput detection and identification of micro and nano-scale defects by inspection tools (such as a Scanning Electron Microscope ('SEM')) is essential for maintaining high yield and low cost.

A SEM comprises a scanning device and a detector apparatus. The scanning device comprises an illumination apparatus that comprises an electron source, for generating primary electrons, and a projection apparatus for scanning a sample, such as a substrate, with one or more focused beams of primary electrons. Together at least the illumination apparatus, or illumination system, and the projection apparatus, or projection system, may be referred to together as the electron-optical system or apparatus. The primary electrons interact with the sample and generate secondary electrons. The detection apparatus captures the secondary electrons from the sample as the sample is scanned so that the SEM can create an image of the scanned area of the sample. For high throughput inspection, some of the inspection apparatuses use multiple focused beams, i.e. a multi-beam, of primary electrons. The component beams of the multi-beam may be referred to as sub-beams or beamlets. A multi-beam can scan different parts of a sample simultaneously. A multi-beam inspection apparatus can therefore inspect a sample at a much higher speed than a single-beam inspection apparatus.

An implementation of a known multi-beam inspection apparatus is described below.

The figures are schematic. Relative dimensions of components in drawings are therefore exaggerated for clarity. Within the following description of drawings the same or like reference numbers refer to the same or like components or entities, and only the differences with respect to the individual embodiments are described. While the description and drawings are directed to an electron-optical apparatus, it is appreciated that the embodiments are not used to limit the present disclosure to specific charged particles. References to electrons throughout the present document may therefore be considered more generally as references to charged particles, with the charged particles not necessarily being electrons.

Reference is now made to FIG. 1, which is a schematic diagram illustrating an exemplary charged particle beam inspection apparatus 100, which may also be referred to as a charged particle beam assessment system or simply assessment system. The charged particle beam inspection apparatus 100 of FIG. 1 includes a main chamber 10, a load lock chamber 20, an electron beam tool 40, an equipment front end module (EFEM) 30 and a controller 50. Electron beam tool 40 is located within main chamber 10.

EFEM 30 includes a first loading port 30*a* and a second loading port 30*b*. EFEM 30 may include additional loading port(s). First loading port 30*a* and second loading port 30*b* may, for example, receive substrate front opening unified pods (FOUPs) that contain substrates (e.g., semiconductor substrates or substrates made of other material(s)) or samples to be inspected (substrates, wafers and samples are collectively referred to as "samples" hereafter). One or more robot arms (not shown) in EFEM 30 transport the samples to load lock chamber 20.

Load lock chamber 20 is used to remove the gas around a sample. This creates a vacuum that is a local gas pressure lower than the pressure in the surrounding environment. The load lock chamber 20 may be connected to a load lock vacuum pump system (not shown), which removes gas particles in the load lock chamber 20. The operation of the load lock vacuum pump system enables the load lock chamber to reach a first pressure below the atmospheric pressure. After reaching the first pressure, one or more robot arms (not shown) transport the sample from load lock chamber 20 to main chamber 10. Main chamber 10 is connected to a main chamber vacuum pump system (not shown). The main chamber vacuum pump system removes gas particles in main chamber 10 so that the pressure in around the sample reaches a second pressure lower than the first pressure. After reaching the second pressure, the sample is transported to the electron beam tool by which it may be inspected. An electron beam tool 40 may comprise a multi-beam electron-optical apparatus.

Controller 50 is electronically connected to electron beam tool 40. Controller 50 may be a processor (such as a computer) configured to control the charged particle beam inspection apparatus 100. Controller 50 may also include a processing circuitry configured to execute various signal and image processing functions. While controller 50 is shown in FIG. 1 as being outside of the structure that includes main chamber 10, load lock chamber 20, and EFEM 30, it is appreciated that controller 50 may be part of the structure. The controller 50 may be located in one of the component elements of the charged particle beam inspection apparatus or it can be distributed over at least two of the component elements. While the present disclosure provides examples of main chamber 10 housing an electron beam inspection tool, it should be noted that aspects of the disclosure in their broadest sense are not limited to a chamber housing an electron beam inspection tool. Rather, it is appreciated that the foregoing principles may also be applied to other tools and other arrangements of apparatus, that operate under the second pressure.

Figure 2:
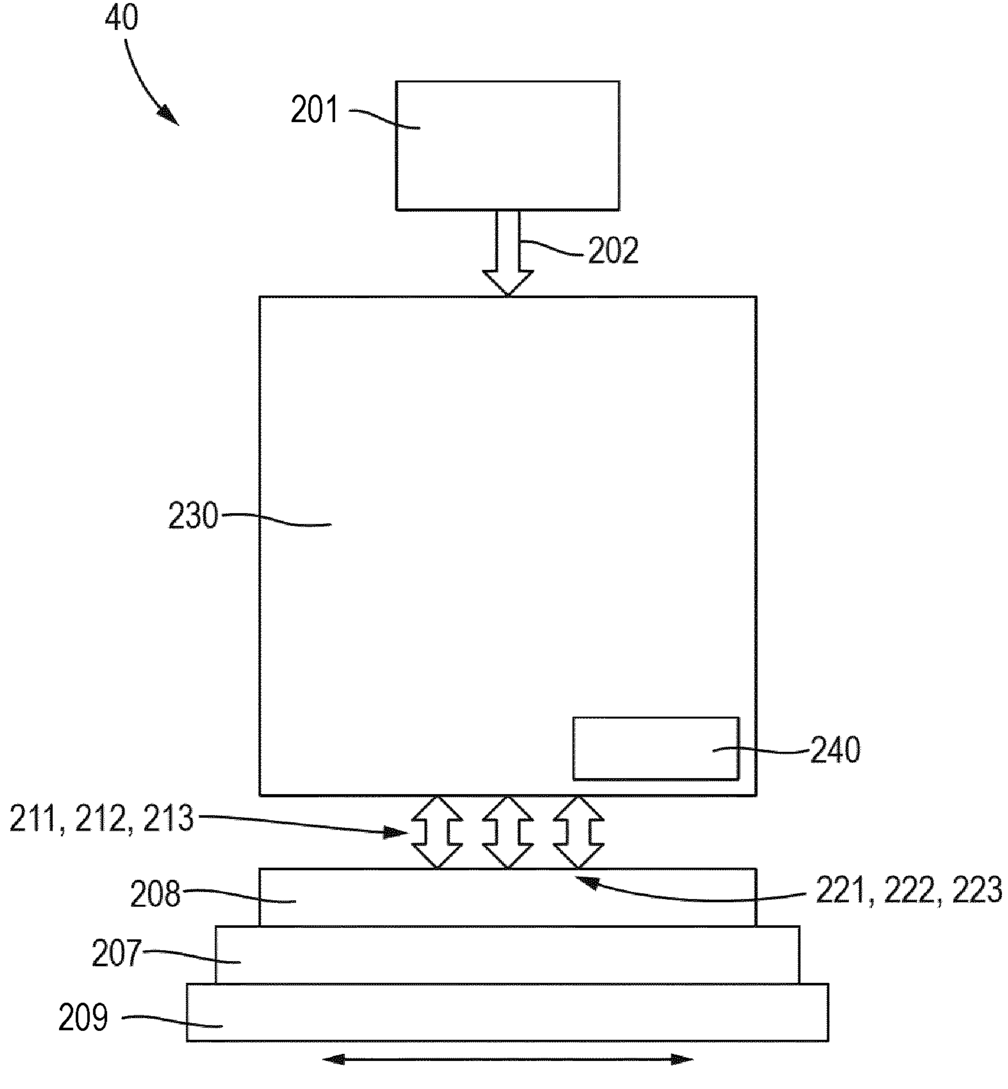
FIG. 2 is a schematic diagram illustrating an exemplary multi-beam apparatus that is part of the exemplary charged particle beam inspection apparatus of FIG. 1.

Reference is now made to FIG. 2, which is a schematic diagram illustrating an exemplary electron beam tool 40 including a multi-beam inspection tool that is part of the exemplary charged particle beam inspection apparatus 100 of FIG. 1. Multi-beam electron beam tool 40 (also referred to herein as apparatus 40) comprises an electron source 201, a projection apparatus 230, a motorized stage 209, and a sample holder 207. The electron source 201 and projection apparatus 230 may together be referred to as an illumination apparatus. The sample holder 207 is supported by motorized or actuated stage 209 so as to hold a sample 208 (e.g., a substrate or a mask) for inspection. Multi-beam electron beam tool 40 further comprises an electron detection device 240.

Electron source 201 may comprise a cathode (not shown) and an extractor or anode (not shown). During operation, electron source 201 is configured to emit electrons as primary electrons from the cathode. The primary electrons are extracted or accelerated by the extractor and/or the anode to form a primary electron beam 202.

Projection apparatus 230 is configured to convert primary electron beam 202 into a plurality of beams 211, 212, 213 and to direct each beam onto the sample 208. Although three beams are illustrated for simplicity, there may be many tens, many hundreds, many thousands, many tens of thousands, or even hundreds of thousands (or more) of beams. The plurality of beams may be referred to as a plurality of sub-beams or beamlets. The beams may be arranged relative to each other in a pattern in a plane perpendicular to a direction of propagation of the beams. The pattern may be referred to as a beam pattern, sub-beam pattern, or beamlet pattern. The beams may have an arrangement with respect to each other having the pattern, which may be referred to as a beam arrangement or a multi-beam arrangement. The pattern may take the form of a grid or a plurality of grids, each grid being regular or irregular and being of any suitable geometry (e.g. square, rectangular, hexagonal, etc.). The pattern may contain plural areas that each contain multiple beams in a grid. Each such area may be referred to as a beam area. The pattern may additionally contain one or more areas where beams are absent. Each such area may be referred to as a non-beam area. One or more of the non-beam areas may be positioned between two or more of the beam areas. Examples of such beam areas and non-beam areas are described below with reference to FIG. 20.

Controller 50 may be connected to various parts of charged particle beam inspection apparatus 100 of FIG. 1, such as electron source 201, electron detection device 240, projection apparatus 230, and motorized stage 209. Controller 50 may perform various image and signal processing functions. Controller 50 may also generate various control signals to govern operations of the charged particle beam inspection apparatus, including the charged particle multi-beam apparatus.

Projection apparatus 230 may be configured to focus beams 211, 212, and 213 onto a sample 208 for inspection and may form three probe spots 221, 222, and 223 on the surface of sample 208. Projection apparatus 230 may be configured to deflect primary beams 211, 212, and 213 to scan probe spots 221, 222, and 223 across individual scanning areas in a section of the surface of sample 208. In response to incidence of primary beams 211, 212, and 213 on probe spots 221, 222, and 223 on sample 208, electrons are generated from the sample 208 which include secondary electrons and backscattered electrons which may be referred to as signal particles. The secondary electrons typically have electron energy≤50 eV and backscattered electrons typically have electron energy between 50 eV and the landing energy of primary beams 211, 212, and 213.

Electron detection device 240 is configured to detect secondary electrons and/or backscattered electrons and to generate corresponding signals which are sent to controller 50 or a signal processing system (not shown), e.g. to construct images of the corresponding scanned areas of sample 208. Electron detection device may be incorporated into the projection apparatus or may be separate therefrom, with a secondary optical column being provided to direct secondary electrons and/or backscattered electrons to the electron detection device.

The controller 50 may comprise image processing system that includes an image acquirer (not shown) and a storage device (not shown). For example, the controller may comprise a processor, computer, server, mainframe host, terminals, personal computer, any kind of mobile computing devices, and the like, or a combination thereof. The image acquirer may comprise at least part of the processing function of the controller. Thus the image acquirer may comprise at least one or more processors. The image acquirer may be communicatively coupled to an electron detection device 240 of the apparatus 40 permitting signal communication, such as an electrical conductor, optical fiber cable, portable storage media, IR, Bluetooth, internet, wireless network, wireless radio, among others, or a combination thereof. The image acquirer may receive a signal from electron detection device 240, may process the data comprised in the signal and may construct an image therefrom. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. The storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

The image acquirer may acquire one or more images of a sample based on an imaging signal received from the electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time period. The multiple images may be stored in the storage. The controller 50 may be configured to perform image processing steps with the multiple images of the same location of sample 208.

The controller 50 may include measurement circuitry (e.g., analog-to-digital converters) to obtain a distribution of the detected secondary electrons. The electron distribution data, collected during a detection time window, can be used in combination with corresponding scan path data of each of primary beams 211, 212, and 213 incident on the sample surface, to reconstruct images of the sample structures under inspection. The reconstructed images can be used to reveal various features of the internal or external structures of sample 208. The reconstructed images can thereby be used to reveal any defects that may exist in the sample.

The controller 50 may control motorized stage 209 to move sample 208 during inspection of sample 208. The controller 50 may enable motorized stage 209 to move sample 208 in a direction, preferably continuously, for example at a constant speed, at least during sample inspection. The controller 50 may control movement of the motorized stage 209 so that it changes the speed of the movement of the sample 208 dependent on various parameters. For example, the controller may control the stage speed (including its direction) depending on the characteristics of the inspection steps and/or scans of the scanning process for example as disclosed in EPA 21171877.0 filed 3 May 2021 which is hereby incorporated in so far as the combined stepping and scanning strategy at least of the stage.

Figure 3:
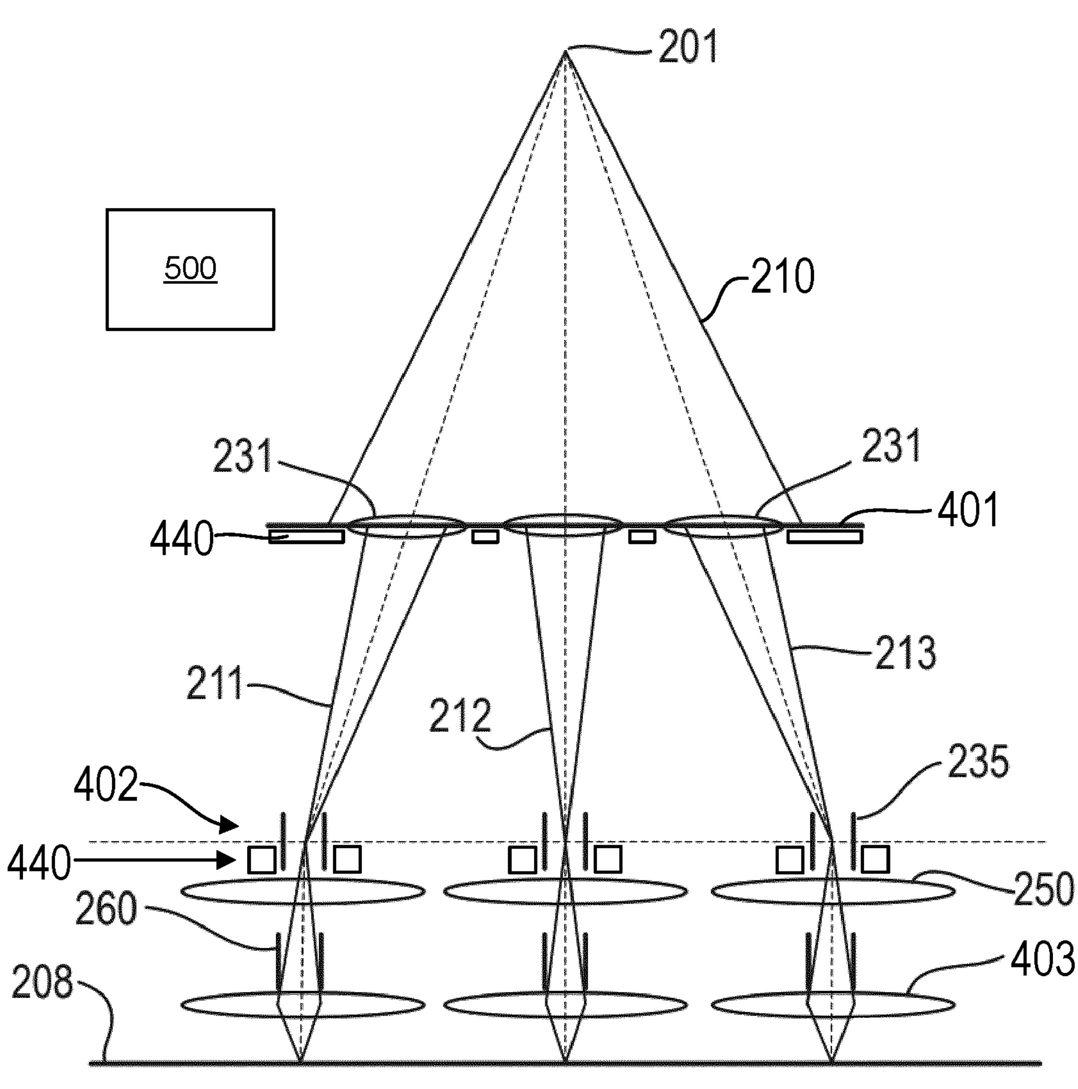
FIG. 3 is a schematic diagram of an exemplary electron-optical column comprising a condenser lens array.
Figure 7:
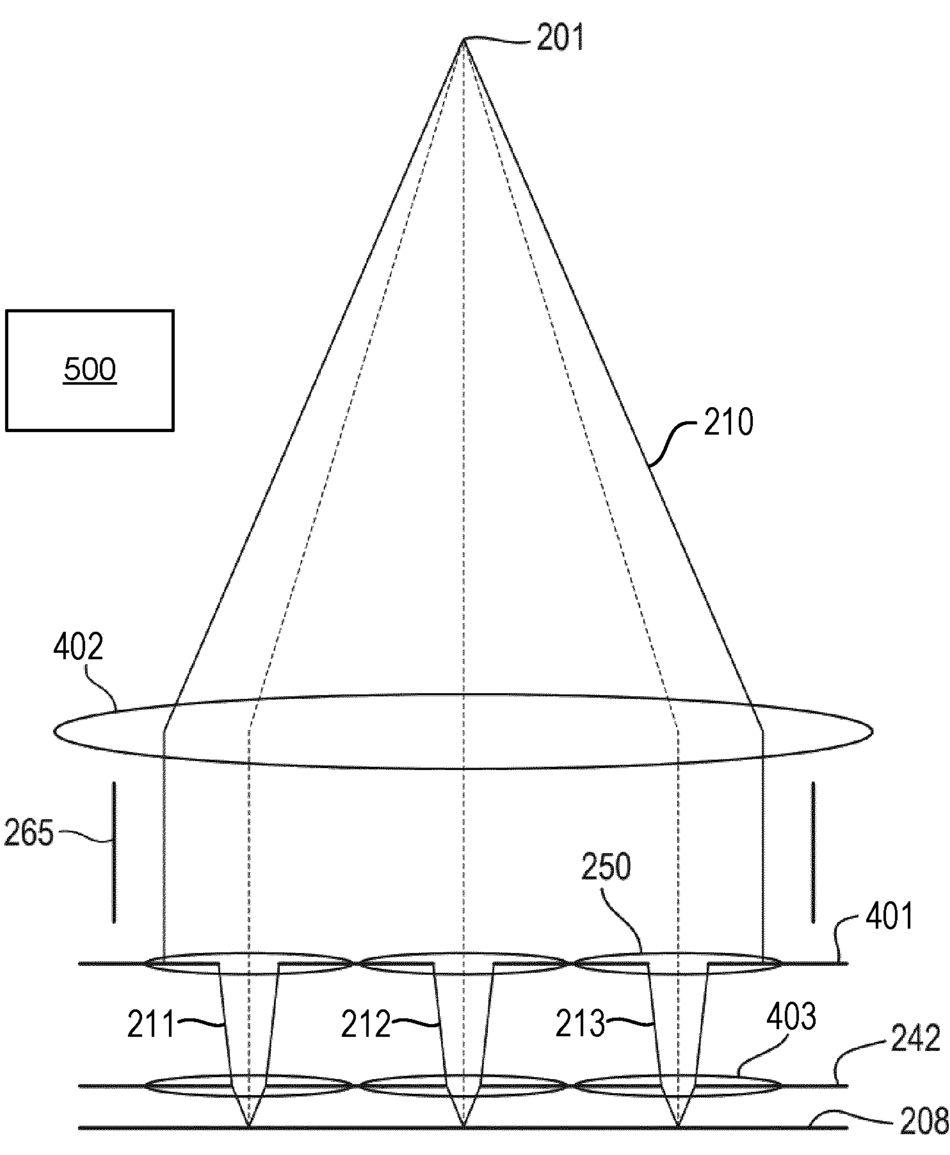
FIG. 7 is a schematic diagram of an exemplary electron-optical column comprising a macro collimator and macro scan deflector.

FIGS. 3 and 7 are schematic diagrams of exemplary electron-optical columns for use in an assessment system. The electron-optical columns may form part of corresponding electron-optical devices (e.g., including elements that are not part of what may be commonly referred to as a column). Such electron-optical columns and devices are examples of charged-particle optical columns and devices using electrons as the charged particles. Each column projects a plurality of beams 211, 212, 213 to a sample 208. For ease of illustration, lens arrays are depicted schematically herein by arrays of oval shapes. Each oval shape represents one of the lenses in the lens array. The oval shape is used by convention to represent a lens, by analogy to the biconvex form often adopted in optical lenses. In the context of charged-particle arrangements such as those discussed herein, it will be understood however that lens arrays will typically operate electrostatically and so may not require any physical elements adopting a biconvex shape. As described below, lens arrays may instead comprise one or more plates with apertures. Each plate with apertures may be referred to as an electrode. One or more macro electrodes may also be provided. The electrodes may be provided in series along paths of the plurality of beams 211, 212, 213.

The column comprises an aperture array 401 for generating the plurality of beams 211, 212, 213. The aperture array 401 generates the beams 211, 212, 213 from a source beam 210 provided by a source 201. The source 201 may comprise an electron source 201. The electron source is desirably a high brightness thermal field emitter with a good compromise between brightness and total emission current. The source beam 210 is incident on the aperture array 401. The aperture array 401 splits the source beam 401 to generate the beams 211, 212, 213.

The column comprises a collimator 402. The collimator 402 collimates paths of the beams 211, 212, 213.

Figures 4, 5:
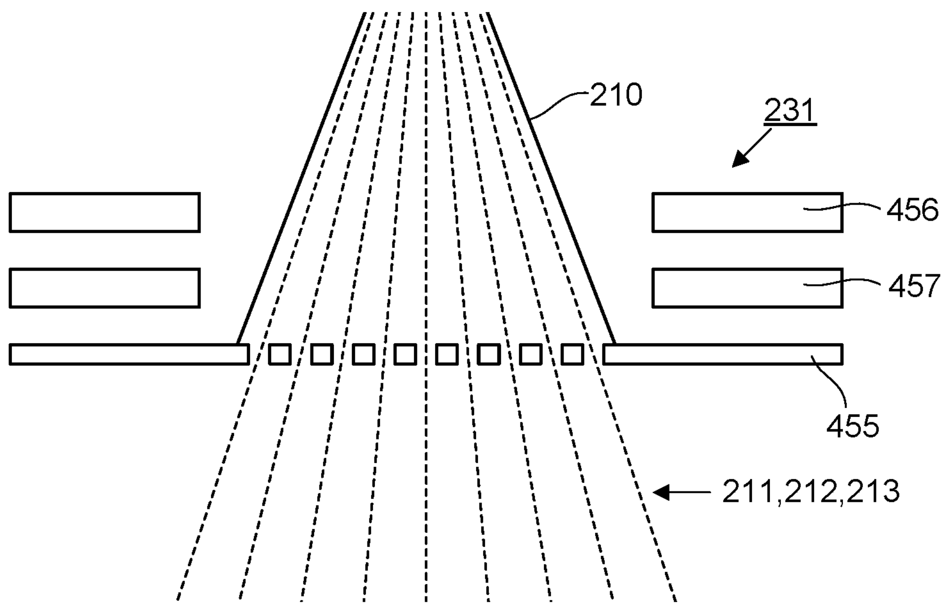
FIG. 4 is a schematic diagram of an exemplary condenser lens array including macro electrodes.
FIG. 5 is a schematic diagram of an exemplary objective lens array including macro electrodes.

The column comprises an objective lens array 403. The objective lens array 403 projects the beams 211, 212, 213 onto the sample 208. The objective lens array 403 may demagnify the beams 211, 212, 213. The objective lens array 403 comprises a plurality of electrodes arranged along a path of the plurality of beams 211, 212, 213. The objective lens array 403 comprises a plurality of objective lenses. Each objective lens is defined by a plurality of electrodes along the path of a respective one of the beams 211, 212, 213. Each objective lens comprises at least two electrodes (e.g., two or three electrodes) connected to respective potential sources. For example, the objective lens array 403 comprises two or more (e.g., three) plate electrode arrays connected to respective potential sources, preferably with insulating plates in between. The plate electrode arrays of the objective lens array 403 may be referred to as objective electrodes. Each objective lens formed by the plate electrode arrays may be a micro-lens operating on a different beam or group of beams of the plurality of beams 211, 212, 213. Each plate defines a plurality of apertures (which may also be referred to as holes). The position of each aperture in a plate corresponds to the position of a corresponding aperture (or corresponding hole) in the other plate (or plates). The corresponding apertures define the objective lenses and each set of corresponding holes therefore operates in use on the same beam or group of beams. In another example, as exemplified in FIG. 5, the objective lens array 403 is implemented using a single electrode 301 having apertures corresponding to respective beams of the plurality of beams 211, 212, 213 in combination with one or more macro electrodes 451, 452. The macro electrodes 451, 452 and electrode 311 generate an electric field adjacent to the apertures to provide a desired lensing effect at the apertures. It will typically be desirable for the electrode 301 to be the dominant lens, which means it should be the electrode at which the beam energy is lowest. For a decelerating lens arrangement such as that shown in FIG. 5 the electrode 301 will thus be the lowest electrode (i.e. lower than the macro electrodes 451 and 452). In an accelerating lens alternative, the objective lens array of FIG. 5 could be flipped in the vertical direction, such that the electrode 301 is higher than the macro electrodes 451, 452 (i.e. at a position where the beam energy would be lower than at the macro electrodes).

The objective lenses operate on the principle that an aperture in a conductive plate will have a lensing effect where an electric field is present on one side of the aperture and a beam of charged particles passes through the aperture. Each aperture operating in this way may be referred to as an elementary lens or aperture lens. The focal length, f, of such an elementary lens depends on the energy of the sub-beam, U, and the electric field strength, E, according to $f=4\ U/E$. In arrangements where the objective lens array 241 has two electrodes only, for example, each objective lens will comprise two elementary lenses. The first elementary lens will be defined by an aperture in the electrode furthest from the sample 208. The second elementary lens will be defined by an aperture in the electrode closest to the sample. The beam energy at each electrode is defined by the potential applied to the electrode.

If the objective lens is a decelerating lens, the first elementary lens will be a negative lens and the second elementary lens will be a positive lens. The second elementary lens will be stronger (i.e., it has a smaller focal length, f) than the first elementary lens because the beam energy U of the sub-beam is lower when the sub-beam reaches the second elementary lens (i.e., after deceleration).

Conversely, if the objective lens is an accelerating lens, the first elementary lens will be a positive lens and the second elementary lens will be a negative lens. The first elementary lens will be stronger (i.e. it has a smaller focal length, f) than the second elementary lens in this case because the beam energy U of the sub-beam is higher when the sub-beam reaches the second elementary lens (i.e. after acceleration).

The column further comprises a detector for detecting signal particles emitted from the sample 208 (e.g., secondary electrons, backscattered electrons or Auger electrons). Example detectors are described below with reference to FIGS. 8-11.

A controller 500 may be provided for controlling operation of the electron-optical device. The controller 500 may be computer-implemented, with any suitable combination of elements (e.g. CPUs, RAM, etc.) being used to provide the required functionality. The controller 500 may comprise and/or control potential sources. The potential sources may apply potentials to electrodes, the sample 208, and/or other elements. The controller 500 may further control a stage for supporting the sample.

In the example of FIG. 3, the column comprises an array of condenser lenses 231. There may be many tens, many hundreds or many thousands or even tens of thousands of condenser lenses 231. Condenser lenses of array 231 may comprise multi-electrode lenses and have a construction based on EP1602121A1, which document is hereby incorporated by reference in particular to the disclosure of a lens array to split an e-beam into a plurality of sub-beams, with the array providing a lens for each sub-beam. The condenser lens array may take the form of at least two, preferably three, plates, acting as electrodes, with apertures in each plate aligned with apertures in other plates to define paths for sub-beams through the plates. At least two of the plates are maintained during operation at different potentials to achieve the desired lensing effect. Between the plates of the condenser lens array are electrically insulating plates for example made of an insulating material such as ceramic or glass, with one or more apertures for the sub-beams. In an alternative arrangement, one or more of the plates may feature apertures that each have their own electrode, for example with an array of electrodes around their perimeter or arranged in groups of apertures having a common electrode. In another example, as exemplified in FIG. 4, the condenser lenses 231 are implemented using a single electrode 455 having apertures corresponding to respective beams of the plurality of beams in combination with one or more macro electrodes 456, 457. The macro electrodes 456, 457 and electrode 455 generate an electric field adjacent to the apertures to provide a desired lensing effect at the apertures.

The aperture array 401 for generating the beams 211, 212, 213 may form part of the condenser lens array 231. For example, an electrode forming part of the condenser lens array 231 may also function as an aperture array 401 for generating the beams 211, 212, 213. Alternatively, the aperture array 401 for generating the beams 211, 212, 213 may be provided as a separate element (e.g., plate or plate-like body) defining beam-limiting apertures up-beam of the array of condenser lenses 231.

In an arrangement the condenser lens array is formed of three plate arrays in which charged particles have the same energy as they enter and leave each lens, which arrangement may be referred to as an Einzel lens. Thus, dispersion only occurs within the Einzel lens itself (between entry and exit electrodes of the lens), thereby limiting off-axis chromatic aberrations. When the thickness of the condenser lenses is low, e.g. a few mm, such aberrations have a small or negligible effect.

In the example of FIG. 3, each condenser lens in the array 231 directs electrons into a respective one of the beams 211, 212, 213 which is focused at a respective intermediate focus. The collimator 402 in this example comprises an array of deflectors 235 positioned to operate on the respective intermediate foci. The deflectors 235 are configured to bend a respective beam 211, 212, 213 by an amount effective to ensure that the principal ray (which may also be referred to as the beam axis) is incident on the sample 208 substantially normally (i.e. at substantially 90° to the nominal surface of the sample).

In the examples of FIGS. 3 and 7, a control lens array 250 is provided between the collimator 402 and the objective lens array 403. In the example of FIG. 3, the control lens array 250 is provided below (i.e., downbeam from or further from source 201 than) deflectors 235. The control lens array 250 comprises a control lens 251 for each beam 211, 212, 213. Control lens array 250 may comprise two or more, preferably at least three, plate electrode arrays connected to respective potential sources, preferably with insulating plates in between. Each of the plate electrode arrays may be referred to as a control electrode. The control lenses may be controlled to focus respective beams, for example with respect to a down-beam objective lens array. An example function of control lens array 250, usually in combination with the objective lens array, is to optimize the beam opening angle with respect to the demagnification of each beam and/or to control the beam energy delivered to the objective lenses 234, each of which directs a respective beam 211, 212, 213 onto the sample 208.

The control lens array 250 is associated with the objective lens array 241. As described above, the control lens array 250 may be considered as providing electrodes additional to the electrodes 242, 243 of the objective lens array 241. The additional electrodes of the control lens array 250 allow further degrees of freedom for controlling the electron-optical parameters of the sub-beams. In an embodiment the control lens array 250 may be considered to be additional electrodes of the objective lens array 241 enabling additional functionality of the respective objective lenses of the objective lens array 241. In an arrangement such electrodes may be considered part of the objective lens array providing additional functionality to the objective lenses of the objective lens array 241. In such an arrangement, the control lens is considered to be part of the corresponding objective lens, even to the extent that the control lens is only referred to as being a part of the objective lens.

Optionally an array of scan deflectors 260 is provided between the control lens array 250 and the objective lens array 403. The array of scan deflectors 260 comprises a scan deflector 261 for each beam 211, 212, 213. Each scan deflector is configured to deflect a respective beam 211, 212, 213 in one or two directions so as to scan the beam across the sample 208 in one or two directions. Alternatively, as exemplified in FIG. 7, a macro scan deflector may be used instead of the array of scan deflectors 260.

The landing energy of electrons on the sample 208 can be controlled by varying potentials applied to electrodes of the control lens array 250 and objective lens array 403. The control lenses and objective lenses thus work together and may be referred to together as an objective lens assembly. The landing energy can be selected to increase emission and detection of secondary electrons dependent on the nature of the sample being assessed. A controller may be configured to control the landing energy to any desired value within a predetermined range or to a desired one of a plurality of predetermined values. Exchangeable modules may also be employed to vary or control the landing energy. For example the varying or control of the landing energy may be achieved by exchanging different modules each comprising a different arrangement of electron-optical elements.

Desirably, the landing energy is primarily varied by controlling the energy of the electrons exiting the control lens. The potential differences within the objective lenses are preferably kept constant during this variation so that the electric field within the objective lens remains as high as possible. The potentials applied to the control lens in addition may be used to optimize the beam opening angle and demagnification. The control lens can also be referred to as a refocus lens as it can function to correct the focus position in view of changes in the landing energy. Desirably, each control lens comprises three electrodes so as to provide two independent control variables as further discussed below. For example, one of the electrodes can be used to control demagnification while a different electrode can be used to independently control landing energy. Alternatively each control lens may have only two electrodes. When there are only two electrodes, in contrast, one of the electrodes may need to control both demagnification and landing energy. One or more electrodes of the control lens may take the form of a macro electrode, for example with one or more apertures sized for two or more if not all of the beams of the beam arrangement.

Figure 6:
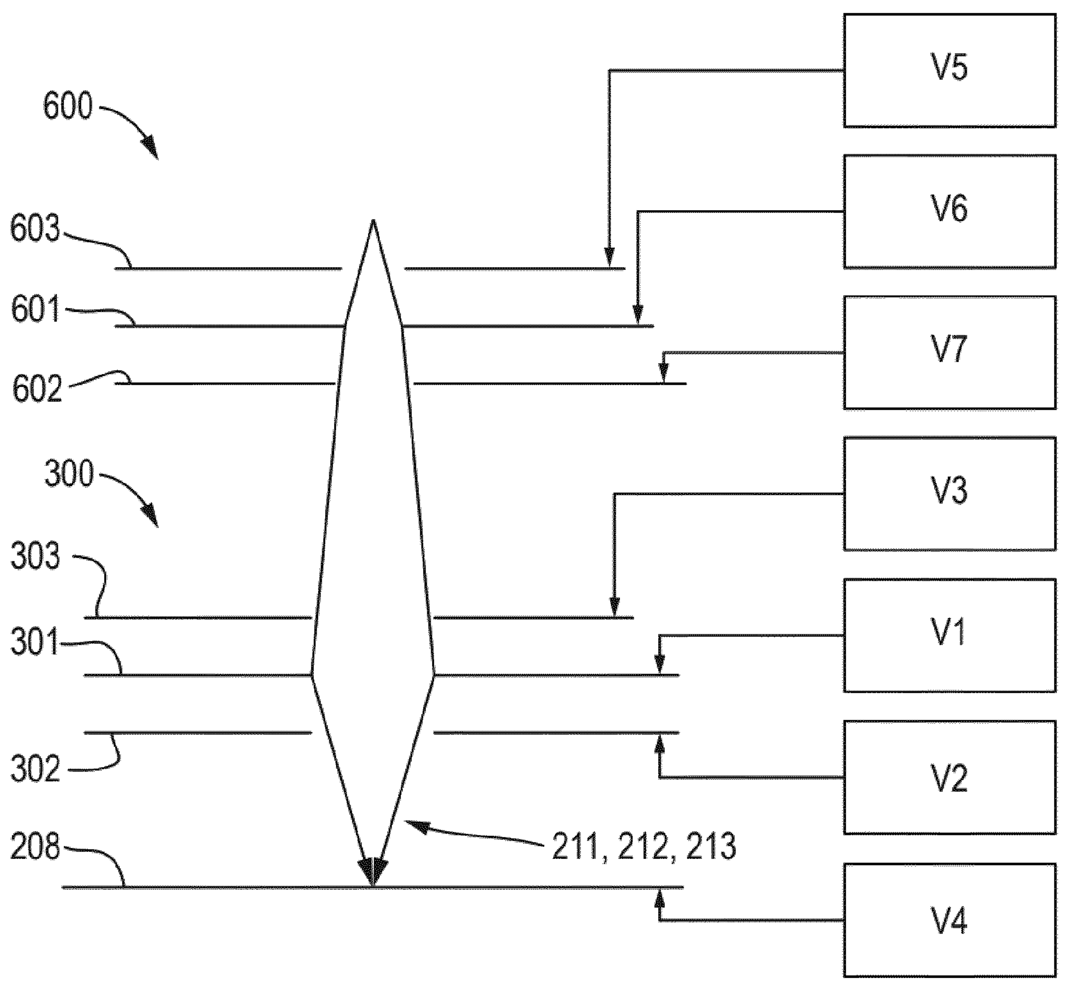
FIG. 6 is an enlarged diagram of an objective lens and a control lens.

FIG. 6 is an enlarged schematic view of a lens arrangement, for example one objective lens 300 of the objective lens array 403 and one control lens 600 of the control lens array 250. The lens arrangement in the schematic representation may comprises a series of electrodes in which an aperture is defined for each beam of the multi-beam array or such electrodes with one or more macro electrodes with an aperture for two or more if not all beams of the beam arrangement, for example as depicted for an objective lens of three electrodes in FIG. 5. In the schematic representation objective lens 300 can be configured to demagnify the electron beam by a factor greater than 10, desirably in the range of 50 to 100 or more. The objective lens comprises a middle or first electrode 301, a lower or second electrode 302 and an upper or third electrode 303. Voltage sources V1, V2, V3 are configured to apply potentials to the first, second and third electrodes respectively. A further voltage source V4 is connected to the sample to apply a fourth potential, which may be ground. Potentials can be defined relative to the sample 208. The first, second and third electrodes are each provided with an aperture through which the respective sub-beam propagates. The second potential can be similar to the potential of the sample, e.g. in the range of from 50 V to 200 V more positive than the sample. Alternatively the second potential can be in the range of from about +500 V to about +1,500 V relative to the sample. A higher potential is useful if detector elements of a detector array are higher in the column than the lowest electrode. The first and/or second potentials can be varied per aperture or group of apertures to effect focus corrections.

Desirably, in an embodiment the third electrode is omitted. An objective lens having only two electrodes can have lower aberration than an objective lens having more electrodes. A three-electrode objective lens can have greater potential differences between the electrodes and so enable a stronger lens. Additional electrodes (i.e. more than two electrodes) provide additional degrees of freedom for controlling the electron trajectories, e.g. to focus secondary electrons as well as the incident beam.

As mentioned above, it is desirable to use the control lens to determine the landing energy. However, it is possible to use in addition the objective lens 300 to control the landing energy. In such a case, the potential difference over the objective lens is changed when a different landing energy is selected. One example of a situation where it is desirable to partly change the landing energy by changing the potential difference over the objective lens is to prevent the focus of the sub-beams getting too close to the objective lens. This situation can, for example, occur if the landing energy is lowered. This is because the focal length of the objective lens roughly scales with the landing energy chosen. By lowering the potential difference over the objective lens, and thereby lowering the electric field inside the objective lens, the focal length of the objective lens is made larger again, resulting in a focus position further below the objective lens.

In the arrangement depicted, control lens 600 comprises three electrodes 601-603 connected to potential sources V5 to V7. Electrodes 601-603 may be spaced a few millimeters (e.g. 3 mm) apart. The spacing between the control lens and the objective lens (i.e. the gap between lower electrode 602 and the upper electrode of the objective lens) can be selected from a wide range, e.g. from 2 mm to 200 mm or more. A small separation makes alignment easier whereas a larger separation allows a weaker lens to be used, reducing aberrations. Desirably, the potential V5 of the uppermost electrode 603 of the control lens 600 is maintained the same as the potential of the next electron-optic element up-beam of the control lens (e.g. deflectors 235 in the example of FIG. 3). The potential V7 applied to the lower electrode 602 can be varied to determine the beam energy. The potential V6 applied to the middle electrode 601 can be varied to determine the lens strength of the control lens 600 and hence control the opening angle and demagnification of the beam. Desirably, the lower electrode 602 of the control lens and the uppermost electrode of the objective lens and the sample has substantially the same potential. In one design the upper electrode of the objective lens V3 is omitted. In this case desirably the lower electrode 602 of the control lens and electrode 301 of the objective lens have substantially the same potential. It should be noted that even if the landing energy does not need to be changed, or is changed by other means, the control lens can be used to control the beam opening angle. The position of the focus of a sub-beam is determined by the combination of the actions of the respective control lens and the respective objective lens. In the example of FIG. 3, when the control lens rather than the condenser lens is used for opening angle/demagnification correction of the electron beam, the collimator remains at the intermediate focus so there is no need for astigmatism correction of the collimator. In addition, the landing energy can be varied over a wide range of energies whilst maintaining an optimum field strength in the objective lens. This minimizes aberrations of the objective lens. The strength of the condenser lens (if used) is also maintained constant, avoiding any introduction of additional aberrations due to the collimator not being at the intermediate focal plane or to changes in the path of the electron through the condenser lens.

In some embodiments, one or more aberration correctors may be provided. Any one or more of the aberration correctors may be configured for example in any of the ways described below for a corrector array 440 with reference to FIGS. 22 and 23 and individual beam correctors with individually and/or independently controllable electrodes. The one or more aberration correctors may, for example, comprise a slit deflector as disclosed in European application numbers 20168278.8 and 20168281.2, both filed on 6 Apr. 2020, which are hereby incorporated by reference so far as they disclose slit correctors. Additionally or alternatively the aberration correctors may include a corrector taking the form of an array of apertures, for example in a plate, each having an electrode therearound. The electrodes associated with the apertures may be individually and/or independently controllable so that the electron beams may be corrected separately. Around each aperture may be one or more electrodes which may each be individually and/or independently controllable. Such an arrangement is an embodiment of an individual beam corrector which is disclosed in the European Patent publication 2702595 A1 which is hereby incorporated by reference in so far as its disclosure of individual beam correctors, their control, function, application and operation. The aberration correctors reduce one or more aberrations in the beams 211, 212, 213. In the example of FIG. 3, each of at least a subset of the aberration correctors is positioned in, or directly adjacent to, a respective one of the intermediate foci (e.g., in or adjacent to the intermediate image plane). The beams 211, 212, 213 have a smallest cross-sectional area in or near a focal plane such as the intermediate plane. This provides more space for aberration correctors than is available elsewhere, i.e. upbeam or downbeam of the intermediate plane (or than would be available in alternative arrangements that do not have an intermediate image plane).

In an embodiment, aberration correctors positioned in, or directly adjacent to, the intermediate foci (or intermediate image plane) comprise deflectors to correct for the source 201 appearing to be at different positions for different beams. Correctors can be used to correct macroscopic aberrations resulting from the source that prevent a good alignment between each beam 211, 212, 213 and a corresponding objective lens.

The aberration correctors may correct aberrations that prevent a proper column alignment. Such aberrations may also lead to a misalignment between the sub-beams and the correctors. For this reason, it may be desirable to additionally or alternatively position aberration correctors at or near the condenser lenses of condenser lens array 231 (e.g., with each such aberration corrector being integrated with, or directly adjacent to, one or more of the condenser lenses). This is desirable because at or near the condenser lenses of condenser lens array 231 aberrations will not yet have led to a shift of corresponding beams because the condenser lenses are vertically close or coincident with the beam apertures. A challenge with positioning correctors at or near the condenser lenses, however, is that the beams 211, 212, 213 each have relatively large sectional areas and relatively small pitch at this location, relative to locations further downstream. The aberration correctors may be CMOS based individual programmable deflectors as disclosed in EP2702595A1 or an array of multipole deflectors as disclosed EP2715768A2, of which the descriptions of the beamlet manipulators in both documents are hereby incorporated by reference.

In some embodiments, each of at least a subset of the aberration correctors is integrated with, or directly adjacent to, one or more of the objective lenses of the objective lens array 403. In an embodiment, these aberration correctors reduce one or more of the following: field curvature; focus error; and astigmatism.

In some arrangements, apertures in the objective lens array 403 are adapted to compensate for off-axis aberrations in the multi-beam. For example, the apertures of one or more of the objective electrodes may be shaped, sized and/or positioned to compensation for the off-axis aberrations. The apertures may, for example, have a range of different areas to compensate for field curvature, a range of different ellipticities to compensate for astigmatism, and/or a range of different displacements from nominal grid positions to compensate for distortion caused by telecentricity error. See for example EPA 21166214.3 filed on 31 Mar. 2021 which is hereby incorporated by reference so far as off-axis aberration correction.

Various elements of the column may be provided as exchangeable modules. Each exchangeable module can be removed from the system and replaced with a different exchangeable module with a minimal or no modifications being required in other hardware elements of the column. Either or both of the objective lens array 403 and/or, where present, the control lens array 250 may be exchangeable modules. Detector elements such as scintillators may be provided as part of an exchangeable module. A reflective surface such as a mirror of a light guiding arrangement (described below) may be provided as an exchangeable module. Exchangeable modules provide flexibility for optimizing performance for a range of different operating parameters.

In arrangements of the type shown in FIG. 7, the aperture array 401 for generating the beams 211, 212, 213 forms part of the control lens array 250. For example, an electrode forming part of the control lens array 250 may also function as an aperture array 401 for generating the beams 211, 212, 213. Alternatively, the aperture array 401 for generating the beams 211, 212, 213 may be provided as a separate element (e.g., plate or plate-like body) defining beam-limiting apertures up-beam of (e.g. directly adjacent to in the up-beam direction) the control lens array 250.

The collimator 402 in this example comprises a macro collimator. The macro collimator acts on the source beam 210 from the source 201 before the source beam 210 has been split into the plurality of beams 211, 212, 213. The macro collimator bends respective portions of each beam by an amount effective to ensure that a beam axis of each beams 211, 212, 213 is incident on the sample 208 substantially normally (i.e. at substantially 90° to the nominal surface of the sample 208). The macro collimator applies a macroscopic collimation to the beam. The macro collimator may thus act on all of the source beam 210 rather than comprising an array of collimator elements that are each configured to act on a different individual portion of the source beam 210. The macro collimator may comprise a magnetic lens or magnetic lens arrangement comprising a plurality of magnetic lens sub-units (e.g. a plurality of electromagnets forming a multi-pole arrangement). Alternatively or additionally, the macro-collimator may be at least partially implemented electrostatically. The macro-collimator may comprise an electrostatic lens or electrostatic lens arrangement comprising a plurality of electrostatic lens sub-units. The macro collimator may use a combination of magnetic and electrostatic lenses.

In the example shown, a macro scan deflector 265 is provided to cause the beams 211, 212, 213 to be scanned over the sample 208. The macro scan deflector 265 deflects respective portions of the beam from the collimator 402 to cause the beams 211, 212, 213 to be scanned over the sample 208. In an embodiment, the macro scan deflector 256 comprises a macroscopic multi-pole deflector, for example with 8 poles or more. The deflection is such as to cause beams 211, 212, 213 derived from the source beam 210 to be scanned across the sample 208 in one direction (e.g. parallel to a single axis, such as an X axis) or in two directions (e.g. relative to two non-parallel axes, such as X and Y axes). In some arrangements, the scanning of the beams 211, 212, 213 is coordinated with movement of the sample 208. For example, a combination of scanning the beams 211, 212, 213 parallel to the X axis while moving the sample 208 parallel to the Y axis may be repeated at different stepped positions of the sample 208 to process multiple parallel elongate strips on the sample 208. A larger movement of the sample 208 may then be used to leap to a new processing location on the sample 208. An example of this movement is described in EPA 21171877.0 filed 3 May 2021 which is hereby incorporated in so far as the control of the beam scanning with stage movement. The macro scan deflector 265 acts macroscopically on all of the beam rather than comprising an array of deflector elements that are each configured to act on a different individual portion of the beam. In the embodiment shown, the macro scan deflector 265 is provided between the collimator 401 and the control lens array 250.

In a variation on the example of FIG. 7, a scan-deflector array may be provided to scan the beams 211, 212, 213. The scan-deflector array comprises a plurality of scan deflectors. Each scan deflector scans a respective beam 211, 212, 213 over the sample 208. The scan-deflector array may thus comprise a scan deflector for each beam 211, 212, 213. The deflection is such as to cause the beam 211, 212, 213 to be scanned across the sample 208 in the one or two directions (i.e. one dimensionally or two dimensionally). In an embodiment, the scanning deflectors described in EP2425444, which document is hereby incorporated by reference in its entirety specifically in relation to scan deflectors, may be used to implement the scan-deflector array. The scan-deflector array is positioned between the objective lens array 403 and the control lens array 250. The scan-deflector array may be provided instead of the macro scan deflector 265. In other embodiments both the macro scan deflector 265 and the scan-deflector array are provided and may be operated in synchronization. In some embodiments, as exemplified in FIG. 7, the control lens array 250 is the first deflecting or lensing electron-optical array element in the beam path down-beam of the source 201.

In a further variation on the example of FIG. 7, the collimator 402 may comprise an array of deflectors 235 (a collimator element array), as exemplified in FIG. 3, instead of the macro collimator. The collimator element array may be more spatially compact than a macro collimator. Providing the collimator element array and the scan-deflector array together may therefore provide space saving. This space saving is desirable where a plurality of the electron-optical columns are provided in an electron-optical column array. In such an embodiment there may be no macro condenser lens or a condenser lens array. In this scenario the control lens therefore provides the possibility to optimize the beam opening angle and demagnification for changes in landing energy.

In an embodiment, an electron-optical column array is provided. The array may comprise a plurality of any of the electron-optical columns described herein. Each of the electron-optical columns focuses respective pluralities of beams simultaneously onto different regions of the same sample. Each electron-optical system may form a plurality of beams from a source beam of charged particles derived from a different respective source 201. Each respective source 201 may be one source in a plurality of sources 201. At least a subset of the plurality of sources 201 may be provided as a source array. The source array may comprise a plurality of emitters on a common substrate. The focusing of plural multi-beams (each comprising a plurality of beams 211, 212, 213) simultaneously onto different regions of the same sample allows an increased area of the sample 208 to be processed (e.g., assessed) simultaneously. The electron-optical columns in the array may be arranged adjacent to each other so as to project the respective multi-beams onto adjacent regions of the sample 208. Any number of electron-optical columns may be used in the array. Preferably, the number of electron-optical columns is in the range of from 9 to 200. In an embodiment, the electron-optical columns are arranged in a rectangular array or in a hexagonal array. In other embodiments, the electron-optical columns are provided in an irregular array or in a regular array having a geometry other than rectangular or hexagonal. Each electron-optical column in the array may be configured in any of the ways described herein when referring to a single electron-optical column. As mentioned above, the scan-deflector array 260 and collimator element array are particularly well suited to incorporation into an electron-optical column array because of their spatial compactness, which facilitates positioning of the electron-optical columns close to each other. In some arrangements, a detector for detecting signal particles is implemented using scintillators and a light sensor to detect the light generated by the scintillators. This approach may advantageously reduce the need for complex arrangements to implement active electronics close to the sample, where space may be restricted (e.g., within the objective lens array 403). On the other hand, bulky arrangements for guiding light from the scintillators to the light sensor may restrict how closely together beams can be at the sample. For example, optical fibers and their associated shielding take up significant amounts of space.

Figure 8:
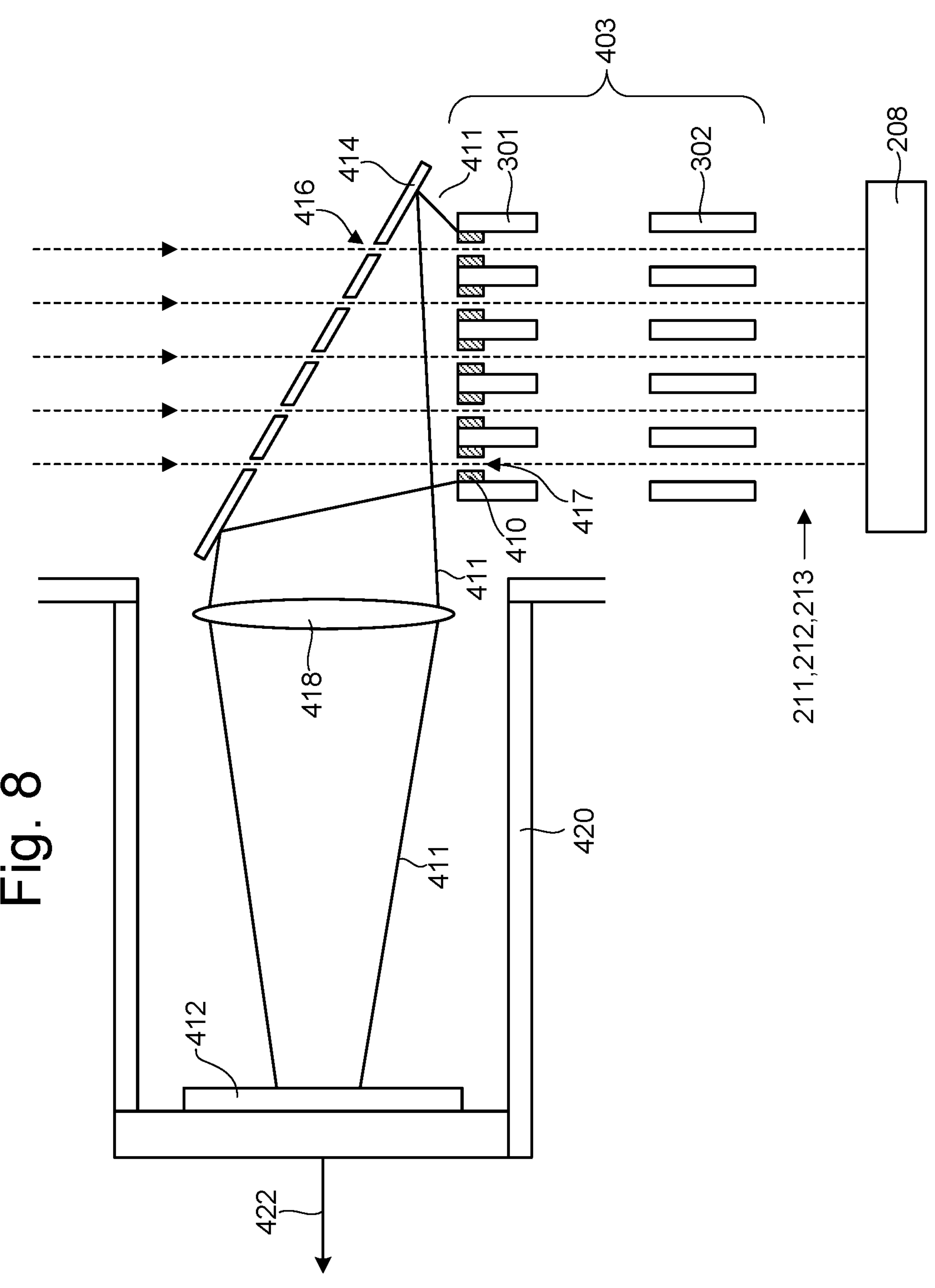
FIG. 8 is a schematic diagram illustrating a portion of an electron-optical device comprising a plurality of scintillators and a light guiding arrangement.

FIG. 8 schematically depicts a scintillator-based detector approach that facilitates close packing of beams at the sample 208. For ease of depiction, FIG. 8 depicts only a portion of an example charged-particle column in the vicinity of an objective lens array 403 of the column and the sample 208. The column may comprise an electron-optical device that may take any of the forms described above with reference to FIGS. 3-7. The column comprises an aperture array 401 and a collimator 402 up-beam of the region of the column shown in FIG. 8. The aperture array 401 generates a plurality of beams. The collimator 402 collimates paths of the beams. The detector in this example comprises a plurality of scintillators 410 and a light sensor 412. The plurality of scintillators 410 may be referred to as a scintillator array. Broken line paths depict representative paths of the beams. The scintillators 410 receive signal particles emitted from the sample 208. The scintillators 410 generate light 411 in response to the received signal particles. The scintillators 410 may comprise luminescent material that absorbs energy from incoming particles and re-emits the absorbed energy as light. The light sensor 412 detects light 411 generated by the scintillators 410 and thereby indirectly detects the signal particles.

A light guiding arrangement is provided that reduces or avoids the need for optical fibers. The light guiding arrangement guides light 411 generated by the scintillators 410 to the light sensor 412. The light guiding arrangement comprises a mirror 414. Light 411 generated by the scintillators 410 is reflected by the mirror 414 towards the light sensor 412. (Thus, the mirror is an embodiment of a radiation reflective surface that is reflective of radiation having a wavelength corresponding to the scintillators). Optics 418 may be provided for controlling propagation of reflected light between the mirror 414 and the light sensor 412. The optics 418 may, for example, image the reflected light onto the light sensor 412. The arrangement allows the light sensor 412 to be positioned outside of the part of the column through which the beams pass (i.e. away from the beam arrangement), as indicated schematically in FIG. 8 by the laterally protruding housing 420. The light sensor 412 may thus be provided at a radially distal position relative to the path of the beams. For example, a separation between a central longitudinal axis of the plurality of beams and a radially outermost one of the beams is smaller than a distance from the longitudinal axis to the light sensor 412. The light sensor 412 does not therefore restrict close packing of the beams. The light sensor 412 can furthermore be implemented easily because there are fewer space restrictions at the location of the light sensor 412 than there are closer to the longitudinal axis. Furthermore, the mirror redirects light without requiring optical fibers or the like, thereby further reducing restrictions to close packing of the beams. The light sensor 412 can be provided within a vacuum region or outside of a vacuum region e.g. with a window or other arrangement being provided to transport light from the mirror 414 (in a vacuum region) to the light sensor 412 (outside of the vacuum region).

The light sensor 412 may be implemented using any of various known devices for detecting light, such as a charge-coupled device (CCD) for example. In some arrangements, the light sensor 412 comprises a photodiode array. The light sensor 412 may be configured or selected to have a wavelength sensitivity matched to the scintillator spectrum (i.e. the wavelength spectrum of the photons emitted by the scintillator element). Appropriate data lines 422, of various known arrangements, may be provided for extracting data representing the detected light.

In some arrangements, the light guiding arrangement comprises one or more optical fibers between the mirror 414 and the light sensor 412. The optical fibers collect light from the mirror and guide the light to a location further away from the part of the column through which the beams pass, for example away from the path of the beam arrangement. Using optical fibers in this way provides further flexibility for positioning of the light sensor 412 (and associated electronics and/or data lines).

In some arrangements, at least part of the light guiding arrangement and the objective lens array are structurally connected. A support for the mirror 414 may be structurally connected to and/or support at least a most proximate electrode of the objective lens array 403. For example, the support for the mirror 414 may be structurally connected to a support of the most proximate electrode.

To allow the plurality of beams to pass through the mirror 414, the mirror 414 is configured to define a plurality of apertures 416 through the mirror 414. The apertures 416 are positioned to allow passage of the plurality of beams through the mirror 414 towards the sample 208. Each aperture 416 may thus correspond to a respective one or more of the beams (i.e., be positioned to allow the respective one or more beams to pass through it).

In some arrangements, the scintillators 410 are each configured to receive signal particles originating from interaction between the sample 208 and a respective single one of the plurality of beams from the aperture array 401. Thus, for one position of the column relative to the sample 208, each scintillator 410 receives signal particles from a different portion of the sample 208.

In some arrangements, the scintillators are arranged in an array. The array is orthogonal to the path of the plurality of beams (i.e., substantially orthogonal to each of the paths). The array may comprise a two-dimensional pattern. The two-dimensional pattern may take the form of a grid. The arrangement may be a hexagonal or rectilinear grid. The array of scintillators may correspond geometrically to the array of beams 211, 212, 213. The scintillators may take the form of an annulus around an aperture for the path of a corresponding primary beam (or more than one primary beam). Thus, an aperture may be defined by each scintillator. Each scintillator element in the array of scintillators may have the form of an annulus.

In an arrangement, the scintillators 410 are positioned up-beam of at least one electrode 302 of the objective lens array 403. The scintillators 410 may be positioned up-beam of an electrode 302 facing the sample 208. In some arrangements, as exemplified in FIG. 8, the scintillators 410 are supported by one of the electrodes 301 of the objective lens array 403. In the example shown, the scintillators 410 are supported by an electrode 301 of the objective lens array 403 that is furthest from the sample 208. The scintillators 410 are at the same level as an uppermost portion (furthest from the sample 208) of the electrode 301. In some arrangements, the scintillators 410 are positioned up-beam of the objective lens array 403, for example directly up-beam thereof (e.g., a small distance therefrom and/or with no intervening elements between the scintillators 410 and the objective lens array 403).

Figure 9:
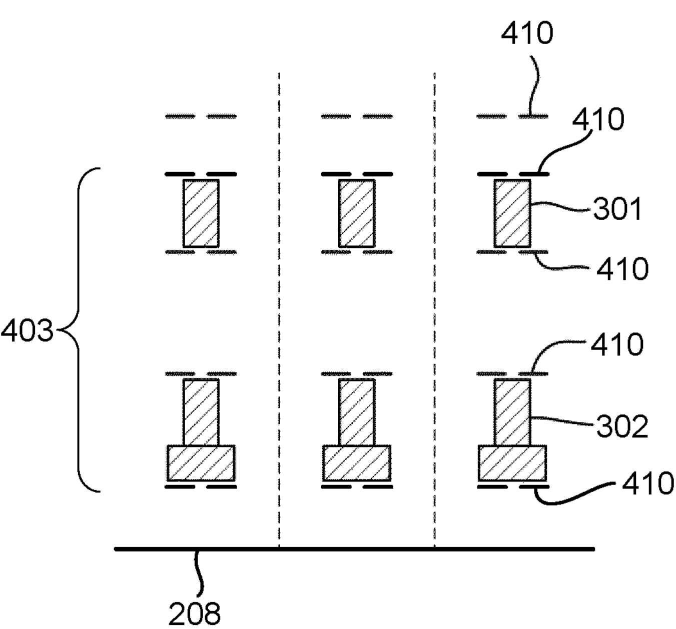
FIG. 9 is a schematic diagram illustrating example positions for the scintillators.

FIG. 9 shows further example locations for the scintillators 410 relative to a portion of an example objective lens array 403. Vertical broken lines depict paths of two example beams through respective objective lenses of the objective lens array 403. Five example locations for the scintillators 410 are shown. The scintillators 410 may be provided at a single one of these five locations or at more than one location. Some of the locations are more favorable than others. The less favorable locations may be used in combination with other locations to capture sufficient signal. The scintillators 410 may be provided below an electrode 302 of the objective lens array 403 that is closest to the sample 208 (e.g. facing the sample 208). The scintillators 410 may be positioned above the electrode 302 closest to the sample 208 and below an electrode 301 adjacent to the electrode 302 closest to the sample 208. In this case, the scintillator 410 may be closer to, and/or attached to, the electrode 302 closest to the sample 208. Alternatively, the scintillator 410 may be closer to, and/or attached to, the adjacent electrode 301. Alternatively, the scintillator 410 may be positioned above the adjacent electrode 301, either directly adjacent and/or attached to the adjacent electrode 301 or separated from the adjacent electrode 301 and/or positioned further away.

In an arrangement, each scintillator 410 surrounds an aperture 417 configured to allow passage of a respective one of the plurality of beams. The aperture 417 may be defined in an electrode of the objective lens or in a separate aperture body. Each scintillator in this arrangement is around the path of a respective beam. Each scintillator 410 may be positioned to receive signal electrons propagating generally along the path of the beam in an opposite direction to the beam. The signal electrons may thus impinge on the scintillator 410 in an annular region. Signal electrons do not impinge on the center region of the annulus because of the aperture for allowing passage of the corresponding primary beam in the opposite direction.

In some arrangements, each scintillator 410 comprises multiple portions. The different portions may be referred to as different zones. Such a scintillator 410 may be referred to as a zoned scintillator. The portions of a scintillator may surround the aperture defined in the scintillator. Signal particles captured by the scintillator portions may be combined into a single signal or used to generate independent signals.

The zoned scintillator 410 may be associated with one of the beams 211, 212, 213. Thus, the multiple portions of one scintillator 410 may be configured to detect signal particles emitted from the sample 208 in relation to one of the beams 211, 212, 213. The scintillator comprising multiple portions may be associated with one of the apertures in at least one of the electrodes of the objective lens array 403. More specifically, the scintillator 410 comprising multiple portions may be arranged around a single aperture.

The portions of the zoned scintillator may be separated in a variety of different ways, e.g. radially, annularly, or in any other appropriate way. Preferably the portions are of similar angular size and/or similar area and/or similar shape. The separated portions may be provided as a plurality of segments, a plurality of annular portions (e.g. a plurality of concentric annuli or rings), and/or a plurality of sector portions (i.e. radial portions or sectors). The scintillator 410 may be divided radially. For example, the scintillator 410 may be provided as annular portions comprising 2, 3, 4, or more portions. More specifically, the scintillator 410 may comprise an inner annular portion surrounding an aperture and an outer annular portion, radially outwards of the inner annular portion. Alternatively, the scintillator 410 may be divided angularly. For example, the scintillator 410 may be provided as sector portions comprising 2, 3, 4, or more portions, for example 8, 12 etc. If the scintillator 410 is provided as two sectors, each sector portion may be a semi-circle. If the scintillator 410 is provided as four sectors, each sector portion may be a quadrant. In an example, the scintillator 410 is divided into quadrants, i.e., four sector portions. Alternatively, the scintillator 410 may be provided with at least one segment portion.

Providing multiple portions concentrically or otherwise may be beneficial because different portions of the scintillator 410 may be used to detect different signal particles, which may be smaller angle signal particles and/or larger angle signal particles, or secondary signal particles and/or backscatter signal particles. Such a configuration of different signal particles may suit a concentrically zoned scintillator 410. The different angled backscatter signal particles may be beneficial in providing different information. For example, for signal particles emitted from a deep hole, small-angle backscatter signal particles are likely to come more from the hole bottom, and large-angle backscatter signal particles are likely to come more from the surface and material around the hole. In an alternative example, small-angle backscatter signal particles are likely to come more from deeper buried features, and large-angle backscatter signal particles are likely to come more from the sample surface or material above buried features.

The scintillators 410 may be provided as scintillator elements each associated with one or more beams of the plurality of beams. Alternatively or additionally, the scintillators 410 may be provided as a monolithic scintillator in which a plurality of apertures are defined, each aperture corresponding to a respective one or more beams of the plurality of beams. In some arrangements, the scintillators are arranged in an array of strips. Each strip may correspond to a group of primary beams. The beams may comprise a plurality of rows of beams and each group may correspond to a respective row.

Figure 10:
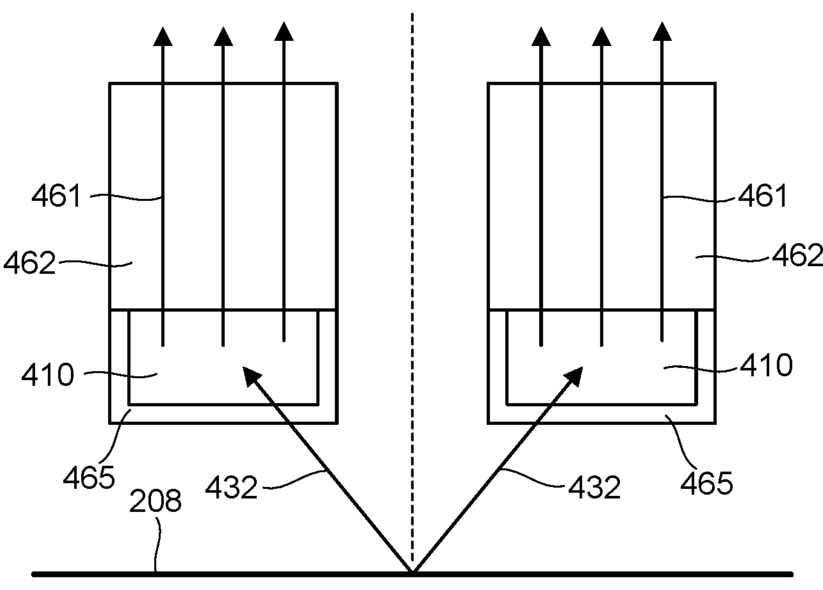
FIG. 10 is a schematic diagram illustrating implementation of a scintillator in combination with a photon guiding element.

In some arrangements, as exemplified FIG. 10, a photon guiding element 462 is provided to guide photons generated by each scintillator 410 towards the mirror 414. FIG. 10 depicts an example arrangement for a single scintillator 410 and associated beam. A path of the beam is depicted by the broken vertical line. Paths of signal particles are schematically depicted by arrows 432. Paths of photons generated in the scintillator 410 are schematically depicted by arrows 461. The arrows are directed upwards towards the mirror 414 (not shown in FIG. 10). The photon guiding element 462 may have any appropriate shape in cross-section in order to provide efficient transport of photons from the scintillator 410. The photon guiding element 462 may be shaped to optimize the photon transport from the scintillator 410. The photon guiding element 462 may comprise any appropriate material, e.g. glass or plastic glass.

In some arrangements, a reflective element 465 is provided adjacent to each scintillator 410. An example reflective element 465 is depicted in FIG. 10. Reflective elements 465 may be provided in combination with any of the disclosed implementations of the scintillators 410 (i.e., not only where photon guiding elements 461 are present between the scintillators 410 and the mirror 414. The reflective element 465 may be positioned over at least a portion of the scintillator 410. That is the reflective element 465 may be on at least a portion of the scintillator 410. The reflective element 465 may be provided on at least one planar side of the scintillator 410 orthogonal to the primary beam path. The reflective element 465 is configured to reflect within the scintillator 410 photons generated in the scintillator 410. This is beneficial as it may improve, or even optimize, reflection of the photons within the scintillator 410 in a desired direction, e.g. towards the mirror 414 or other appropriate optical component. This may be beneficial in avoiding photons leaving the scintillator 410 via other surfaces of the scintillator 410, which would be lost before detection; that is such lost photons would not be detected. The reflective element 465 may serve to improve efficiency of detection of photons generated by the scintillator 410. The reflective element 465 may optimize yield of photons by the scintillator 410 and may improve the signal-to-noise ratio.

The reflective element 465 may be provided as a layer, such as a coating. The reflective element 465 may be a planar portion. The reflective element 465 may be a thin film. The reflective element 465 may be provided in any form or shape. The reflective element 465 may comprise thin tape (e.g. Teflon tape), thin foils and/or reflective paint (e.g. titanium-dioxide). The reflective element 465 may be of any appropriate thickness. Preferably, the reflective element 465 is not thick enough to prevent charged particles of interest from reaching the scintillator 410.

The reflective element 465 may be provided as a layer wrapped (preferably not too tightly) around the scintillator 410 to improve reflection of the light photons. By this wrapping a small air (or vacuum) layer can be created between the scintillator 410 and the reflective element 465, which can lead to a large reflection efficiency (due to the large difference in refractive index between the scintillator 410 and air (or vacuum)).

The scintillator 410 may optionally comprise a photon reflection surface configured to reflect photons with an elevated efficiency. Preferably the photon reflection surface is a surface treated, e.g. by polishing, grinding, etching, and/or chemical treatment, to improve photon reflection in the scintillator 410. The photon reflection surface may have a structured or textured surface to improve (or increase) reflection. For example the structure on the surface may relate to the wavelength of the scintillation light generated by the scintillator 410. Any of the scintillator surfaces may be a photon reflection surface. Preferably, the surfaces facing away from the mirror 414 are photon reflecting surfaces.

It is noted that scintillators are typically capable of detecting charged particles above a detection threshold. The detection threshold may be varied by the selection of a thickness of a conductive coating, such as a metal layer, on the scintillator surface.

Each scintillator 410 may comprise inorganics e.g. alkali halide crystals with atomic (inorganic) impurities. Inorganic crystals may be mostly monocrystalline or polycrystalline. The scintillator 410 may comprise organics, e.g. aromatic hydrocarbon compounds. Organic scintillators can be made from organic single crystals or from plastics, making it simpler to generate a specific shape or configuration. Organic scintillators may be faster (i.e. have a faster detection response to a charged particle due to their shorter light emission time). Organic scintillators may have a lower average atomic number and hence lower stopping power for particles, i.e. a poorer ability for stopping particle. (However, the lower stopping power has little significant impact for the relatively low kinetic energies of the signal particles considered here, which tend to have a maximum energy of approximately 30 keV). Theoretically, the scintillator 410 may comprise organics and inorganics.

Figure 24:
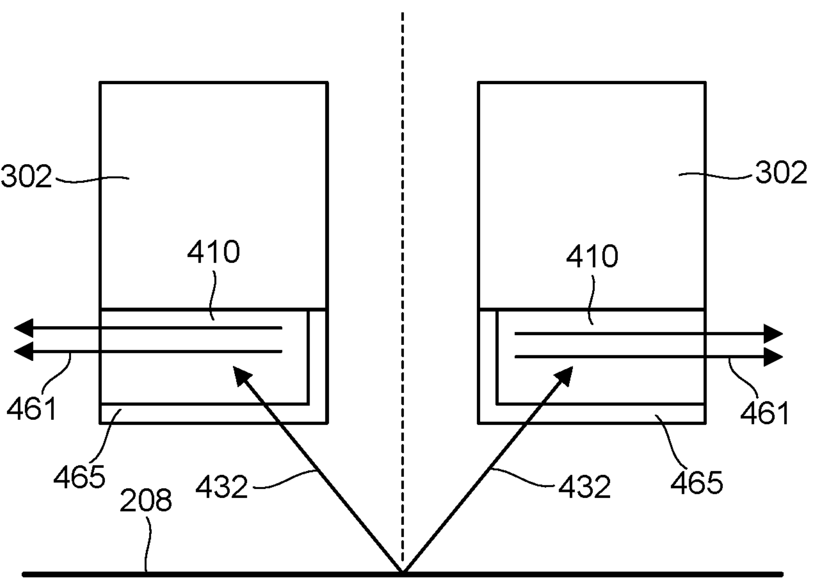
FIG. 24 is a schematic diagram illustrating an alternative implementation of a scintillator in combination with a photon guiding element.

FIG. 24 depicts a variation on the arrangement of FIG. 10 in which a photon guiding element is provided as a planar, integrated waveguide parallel to the sample 208. Instead of being guided upwards towards a mirror 414, in the variation of FIG. 24 photons are guided laterally within the plane of the integrated waveguide, as indicated by arrows 461, towards a sensor element (not shown). The integrated waveguide may form part of a single layer of optical interconnects on a substrate containing the scintillators 410. Like in electrical routing, each scintillator (e.g. fluorescent cell) would be connected to a region outside of the beam arrangement using its own integrated waveguide. An advantage of such integrated waveguides over optical fibers is that the waveguides can be as thin as 1 micron, are fabricated using lithography and are integrated on a silicon substrate. The waveguide can take photons laterally outside of the part of the column through which the primary beams propagate without requiring any mirror 414. Note, that variations of this arrangement and of that depicted and described with reference to FIG. 10 may be provided that use photon guiding elements such as optic fibers and/or a planar waveguide in which the guiding element may take any reasonable angle away from the beam path; the fiber and/or waveguide may, for example, guide photons at an intermediate (oblique) angle between being parallel and orthogonal to the beam path.

Figure 11:
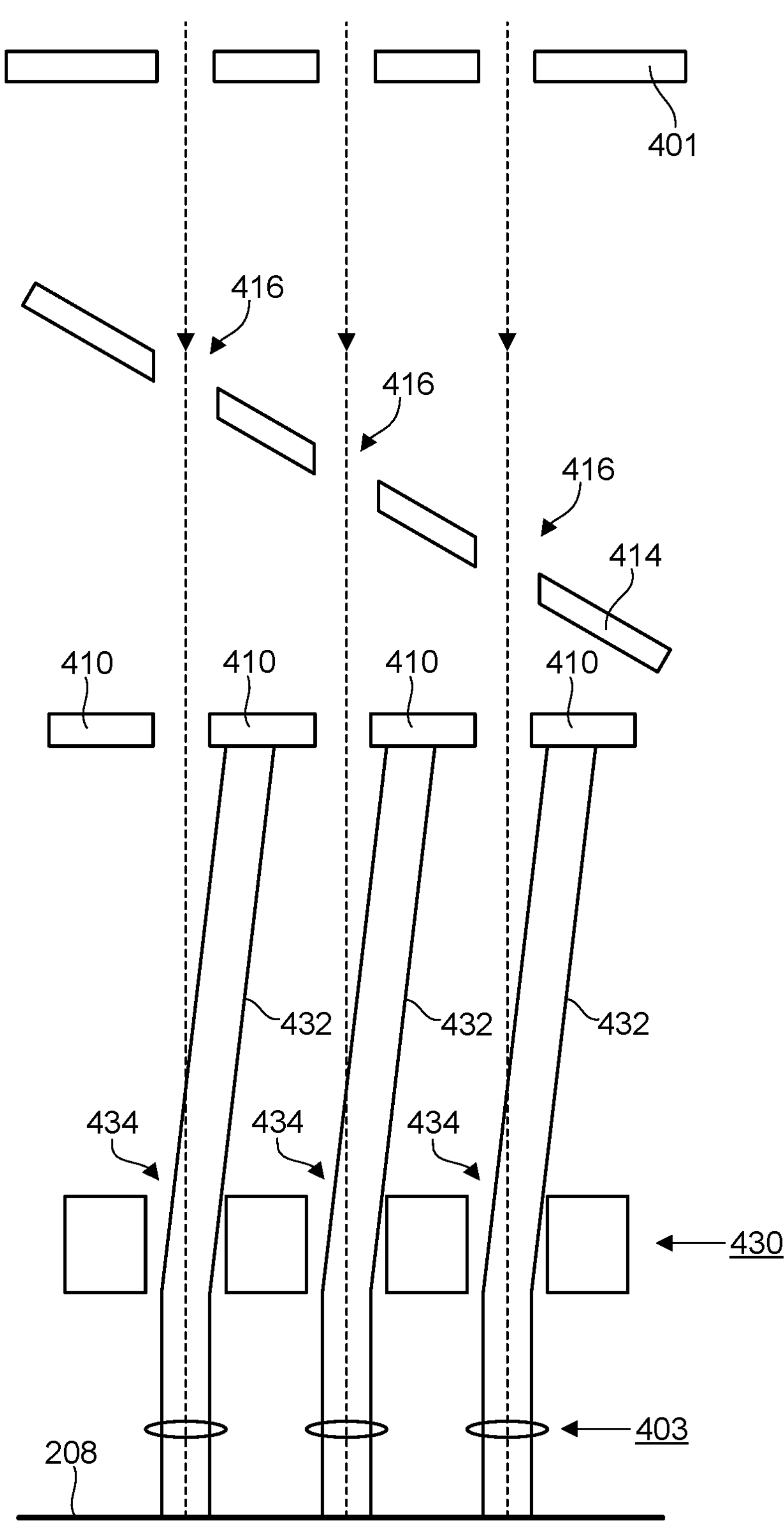
FIG. 11 is a schematic diagram illustrating a portion of an alternative electron-optical device comprising Wien filters, scintillators and a light guiding arrangement.

FIG. 11 depicts a portion of an alternative charged-particle column using Wien filters to assist with detection of signal particles. For ease of depiction, FIG. 11 depicts only a portion of the column in the vicinity of an objective lens array 403 of the column and the sample 208. The column may take any of the forms described above with reference to FIGS. 3-10. The column comprises an aperture array 401. The column may further comprise a collimator 402 (not shown). The aperture array 401 generates a plurality of beams. The collimator 402 collimates paths of the beams. The column comprises a detector comprising a plurality of detector elements that receive signal particles 432 emitted from the sample 208. In the example shown, the detector elements comprise scintillators 410. (Note: the feature denoted as the aperture array in 401 need not be the aperture array, but is representative of an array of electron-optical elements up-beam of mirror 414. The array of electron-optical elements up beam of the mirror includes an aperture array 401. The purpose of depicting an array of electron-optical elements up-beam of the mirror is to indicate that electron-optical components generate beams of the beam arrangement up beam of the mirror 414.)

The column further comprises a Wien filter 430 which may be referred to as a Wien filter arrangement. In the example shown, the Wien filter arrangement comprises a Wien filter array having a plurality of Wien filter elements. The Wien filter array is configured to apply perpendicular electric and magnetic fields across the beam paths of the beam arrangement. Considering from the perspective of the Wien filter elements, each Wien filter element is configured to apply perpendicular electric and magnetic fields in a volume 434 through which charged particles pass. The perpendicular electric and magnetic fields may be applied in different portions of the volume 434. For example, the electric field may be applied up-beam of the magnetic field or vice versa. Each Wien filter element may be defined by an aperture 485 in the Wien filter array that defines the volume 434 when viewed along a path of the beam. So a mechanical component of the Wien filter array in which the apertures of the Wien filters elements are defined may provide the array of Wien filter elements. Thus, the volume 434 may have a shape with a uniform cross-section along the path of the beam. The uniform cross-section has the same shape as the shape of the aperture 485 when viewed along the path of the beam.

Figure 12:
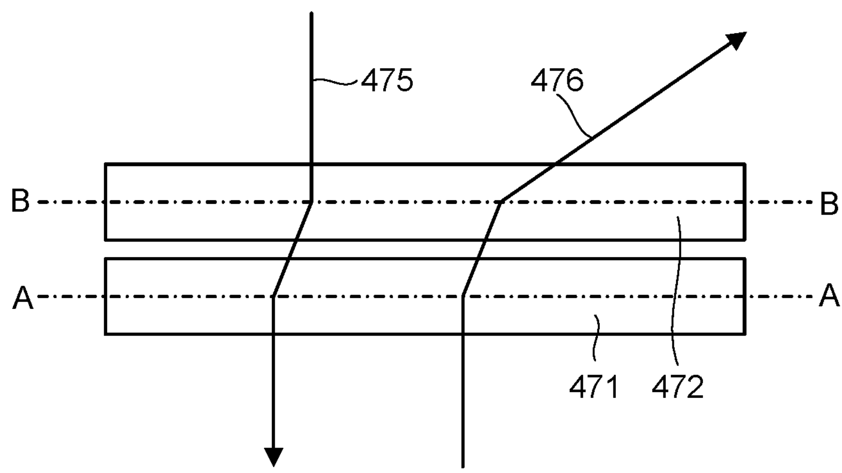
FIG. 12 is a schematic diagram illustrating operation of a Wien filter arrangement.

An example portion of a Wien filter array is depicted schematically in FIG. 12. The Wien filter array comprises an electrostatic component and magnetic component. The electrostatic component may be referred to as an electric field generating unit 471. The magnetic component may be referred to as a magnetic field generating unit 472. The electric field generating unit 471 and the magnetic field generating unit 472 may be considered to be the mechanical components of the Wien filter array. The electric field generating unit 471 generates an electric field, e.g. via potential differences applied between pairs of electrodes. The magnetic field generating unit 471 generates a magnetic field, e.g. via a current flowing in coils e.g. around a magnetic core. The electric and magnetic fields are configured, preferably mutually orientated, to apply oppositely directed forces to the charged particles. The electric and magnetic fields may be configured to provide forces that substantially cancel each other for charged particles in the primary beams propagating towards the sample 208 and that add together, i.e. do not cancel each other, for signal particles travelling in the opposite direction. This is illustrated in FIG. 12 with example primary beam 475 being deflected leftwards by the magnetic field generating unit 472 and then rightwards by the electric field generated unit 471, resulting in no overall deflection for the primary beam 475. In contrast, the rightward deflection applied to the example signal particles 476 is added to by a further rightward deflection applied by the magnetic field generating unit 472, resulting in a net deflection to the right for the signal particles 476. The effect of the Wien filter arrangement 430 may therefore be to deflect signal electrons while not substantially disturbing the primary beams.

As shown in FIG. 11, Wien filter arrangement 430 provides more freedom for positioning detector elements such as scintillators 410. For example, a function of the Wien filter arrangement 430 (e.g. via the Wien filter elements) may be to enable the positioning of the scintillators 410 to be adjusted relative to the design shown in and described with respect to FIG. 8. The scintillators 310 may be arranged in an array that is interleaved between paths of the beams. The scintillators 410 may be arranged in an array with each scintillator 410 displaced relative to a path of a corresponding beam. In the example of FIG. 11, each scintillator 410 is displaced to the side, as depicted to the right, relative to the path of the corresponding primary beam; the primary beam being the beam that generates the signal particles to be captured by the scintillator 410.

Figure 13:
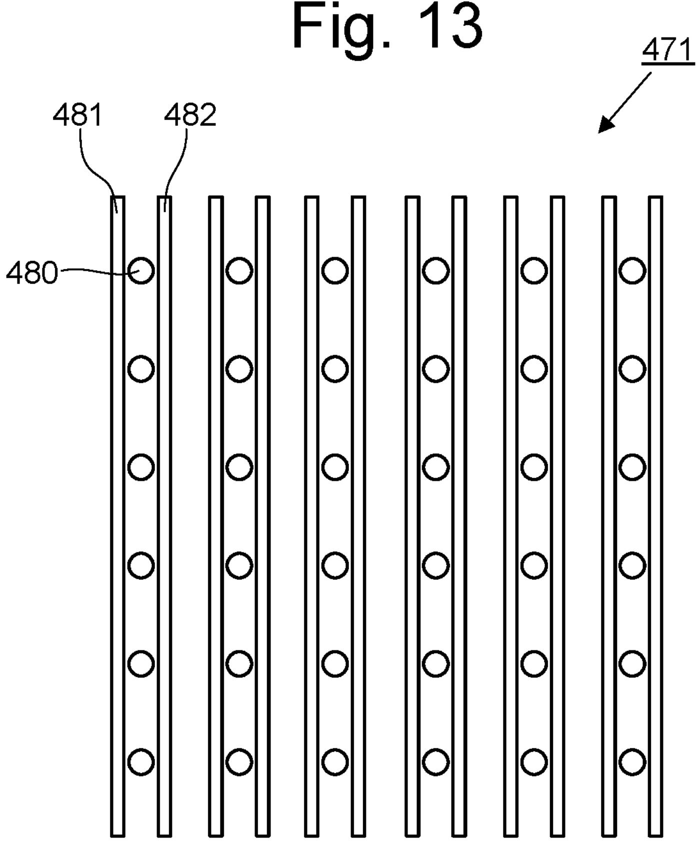
FIG. 13 is a schematic diagram illustrating exemplary electrodes of an electric field generating unit of the Wien filter arrangement of FIG. 12.

FIG. 13 is a schematic sectional view relative to plane A-A in FIG. 12. The view depicts an example configuration for electrodes 481, 482 of an example electric field generating unit 471. The electrodes 481, 482 are a pair of elongate electrodes that face each other. In this example, the electrodes 481, 482 are provided as pairs of parallel plates. Circles 480 schematically depict the positions of primary beams, or at least their paths. The paths of the primary beams pass through gaps between the electrodes 481, 482; that is the paths of the primary beams are between facing surfaces of the respective electrodes 481,482. The paths of the primary beams between the facing surfaces may be in a line which for the purposes of this description is referred to as a column (although the line may in a different arrangement be referred to as a row). One pair of electrodes 481 482 is provided for each of the six example columns of primary beam positions, for example as depicted in FIG. 13. A potential difference is applied between each pair of electrodes. The potential difference generates an electric field between the electrodes, e.g. between their respective facing surfaces. The electric field deflects the primary beams between the electrodes. In the geometry shown, the deflection will be to the left or right in the plane of the page, depending on the relative potential difference between the facing surfaces of the electrodes 481, 482.

Figure 14:
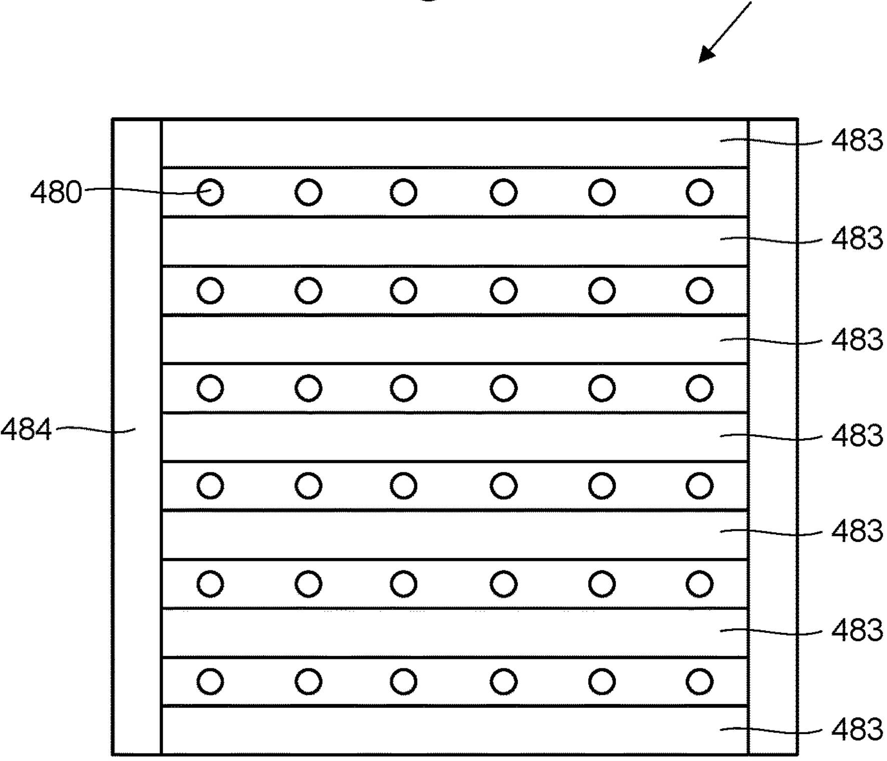
FIG. 14 is a schematic diagram illustrating exemplary coil elements of a magnetic field generating unit of the Wien filter arrangement of FIG. 12.

FIG. 14 is a schematic sectional view relative to plane B-B in FIG. 12. The view depicts an example configuration for an example magnetic field generating unit 472 with a core body (or core plate) of a frame with cross-pieces (depicted horizontally in the example of FIG. 14). The frame may have end pieces (depicted vertically in the example of FIG. 14 and positioned at the left and right ends) and side pieces (depicted horizontally in the example of FIG. 14 and positioned at the top and bottom ends). The side pieces may extend between the end pieces. The cross-pieces extend between the end pieces. The side pieces may be parallel with one or more cross-pieces. An aperture may be defined between adjacent cross-pieces and portions of the end pieces that extend between the adjacent cross-pieces. An aperture may be defined between each side piece and its adjacent cross-piece and the portions of the end pieces extending between the respective side piece and the corresponding adjacent cross-piece. Coils may be around elements of the core body, for example around one or more cross pieces and/or one or both side elements. In an embodiment the cross pieces comprise coils and the side pieces comprise coils. The side pieces and cross pieces may be referred to as coil elements 483. In an embodiment around the end pieces may be coils, which may be referred to as end coil elements. One or more elements of the core body may consist of magnetizable material, preferably ferrite.

Figure 15:
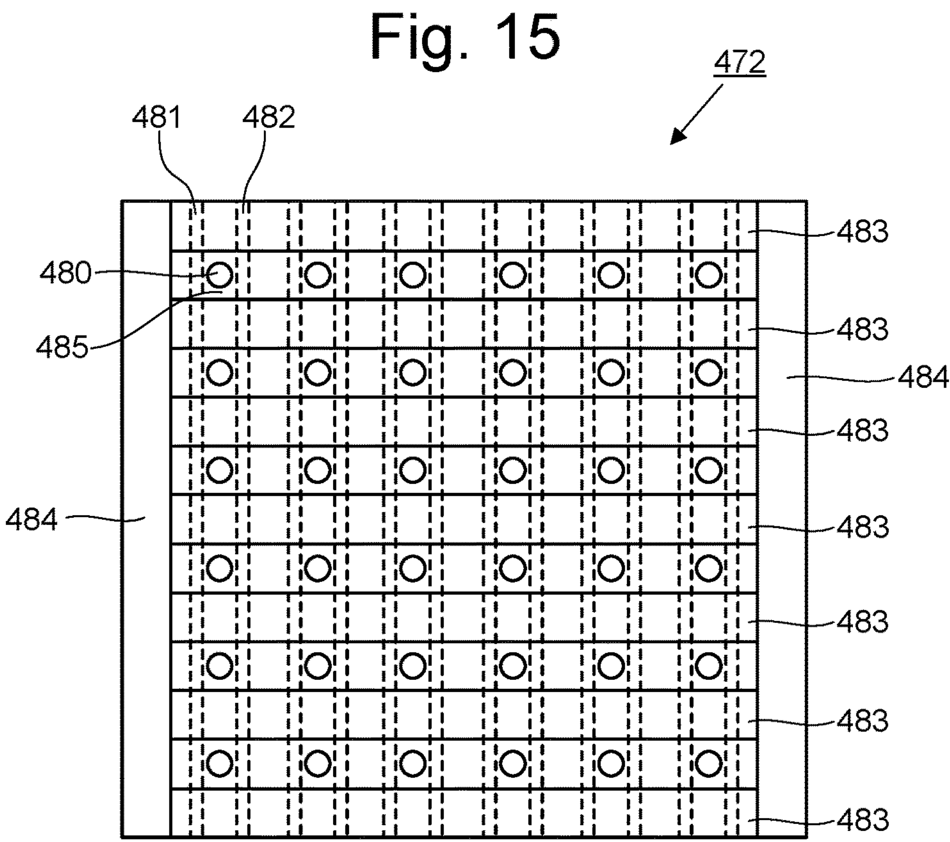
FIG. 15 is a version of FIG. 14 with positions of the electrodes of FIG. 13 shown in broken lines.

Circles 480 schematically depict the positions of primary beams or at least their paths. The paths of the beams pass through gaps between the coil elements 483; that is, through the apertures between the adjacent coil elements (i.e. adjacent cross-pieces or a side piece and an adjacent cross-piece) and the respective portions of the end pieces at the ends of the apertures. The paths of the primary beams between the adjacent coil elements may be in a line which for the purposes of this description is referred to as a row (although the line may in a different arrangement may be referred to as a column). Each coil element 483 comprises a coil configured to generate a magnetic field directed along an axis of the coil (e.g., vertically upwards or downwards in the plane of the page in the orientation shown in FIG. 14). The magnetic field thus deflects primary beams passing through the gaps (or the apertures) between the coil elements 483. In the geometry shown, the deflection will be to the right or left in the plane of the page. (In an embodiment the direction of the deflection for a beam along a path in one direction, for example into the page, is in an opposite direction to the deflection caused by the electrodes 481, 482 shown in FIG. 13. The combination of this deflection and the deflection due to the electric field provides the net deflection from the electrostatic component and the magnetic component applied to the primary beams towards the sample. Thus, the electronstatic component may be considered as an electrostatic deflector. The magnetic component may be considered as a magnetic deflector. For a beam in the opposite direction, along a path for example out of the page, the deflection from the magnetic field is in the same direction to the deflection causes by the electrodes 481, 482. The combination of this deflection and the deflection due to the electric field provides the net deflection applied to the signal beams from the sample by the electrostatic component and the magnetic component of the Wien filter arrangement). In some arrangements, the coils are wound around a magnetic material, for example comprised in the core body, to increase a strength of the magnetic field generated by the current in the coils, although that need not be the case. In some arrangements, terminating members 484 (for example comprising the end pieces) are provided to provide a return path for magnetic flux, i.e. as part of a magnetic circuit, which assists with providing a desired magnetic field strength in the gaps between the coil elements 483. A magnetic circuit formed as much as possible by magnetic material in a core may be desirable to ensure that the magnetic field has sufficient flux density. However, the terminating members (and thus end pieces) may not be present FIG. 15 is a version of FIG. 14 with positions of the electrodes 481, 482 of FIG. 13 shown in broken lines. FIG. 15 may be considered to be a plan view of a Wien filter arrangement with the elements of the Wien filter arrangement covered by other elements of the Wien filter shown in broken line. The arrangement of FIG. 13-15 thus comprises an array of Wien filter elements acting on individual respective primary beams. Each primary beam passes through an aperture 485 defined in the respective Wien filter element by a combination of a gap between a respective pair of the electrodes 481, 482 and a gap between a respective pair of the coil elements 483 (or between an outermost coil element 483 and a terminating member 483). Put another way, each aperture 485 in the Wien filter (i.e. of each respective Wien filter element) is a product of the overlap of an aperture in electric field generating unit 471 and an aperture in the magnetic field generating unit 472 (i.e. an intersection between those apertures). The magnetic component may be referred to as a magnetic deflector array. The electrostatic component may be referred to as an electrostatic deflector array. The Wien filter arrangement may be configured to deflect signal particles towards the detector elements (scintillators 410). Deflecting the signal particles in this manner allows a larger proportion of the signal particles to be detected. This is because the region on each scintillator 410 illuminated by the signal electrons no longer needs to be annular to allow for passage of primary beams in the opposite direction.

To achieve significant deflections, Wien filter elements need to be capable of generating relatively large magnetic fields, or at least of sufficient size, in the gaps between coil elements 483. To generate the large magnetic fields, or at least a magnetic field of sufficient magnitude to adequately influence the paths of the signal particles towards the detector elements, it is necessary to provide material to conduct the magnetic flux to the gaps. This increases space requirements and may limit how closely together the primary beams can be. A balance may need to be made between a maximum size of deflection and a minimum density of primary beams. For example, this challenge is addressed by arranging for each of the Wien filter elements to act on signal particles generated by a different respective group of the primary beams. (Thus the beam arrangement may comprise a plurality of groups of primary beams). This is in contrast to the Wien filter arrangement described above with reference to FIGS. 13-15 in which each Wien filter element acts on signal particles generated by a single respective primary beam (the primary beam having a path through the aperture 485 corresponding to the respective Wien filter element). Each Wien filter element may thus define an aperture (i.e. a single aperture) large enough to allow all of the beams of the respective group to pass through the aperture. The respective aperture may be assigned to a specific group of primary beams of the beam arrangement. The aperture may be dimensioned for passage of the beams of the group along their paths towards the sample. Thus, all paths of the primary beams of a respective group may be through the aperture; the aperture may be around the paths of all the primary beams of the respective group. The aperture may not surround any paths of any other beam of any other group (i.e. the aperture may exclude paths of all beams from all other groups). Preferably, each group of beams comprises a row of the beams and each row extends perpendicularly or obliquely to a direction of the deflection force applied by the respective Wien filter element. Thus, according to the present arrangement, the gaps between coil elements 483 are dimensioned, e.g. large enough, to contain a row of beams perpendicular or oblique to the deflecting force (e.g. parallel or oblique to the magnetic field direction). This is in contrast to the arrangement of coil elements 483 shown in FIGS. 14 and 15, where the gaps between respective pairs of coil elements 483 are wide enough for only a single line of primary beams. The groups of beams comprise plural groups aligned in series in the direction of the rows of beams (e.g. perpendicular to the direction of the deflection force).

Figure 16:
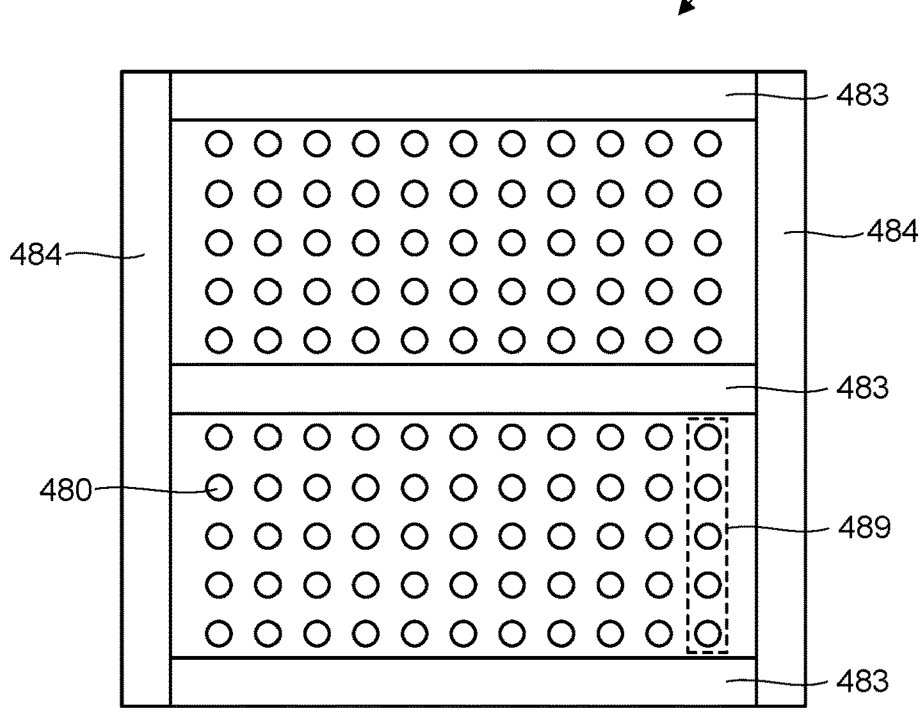
FIG. 16 is a schematic diagram illustrating an exemplary magnetic field generating unit configured to provide Wien filter elements that act on signal particles generated by different respective groups of beams.

An example of a magnetic field generating unit 472 configured to provide such a Wien filter arrangement with constituent Wien filter elements is shown in FIG. 16. FIG. 16 is a schematic sectional view relative to plane B-B through the magnetic component in FIG. 12, corresponding to the arrangement of FIG. 14. It differs from the schematic cross-section through the arrangement of FIG. 14 in having larger gaps between the coil elements 483 and more densely spaced beams in the gaps. Thus the apertures between adjacent coil elements are wider than the arrangement of FIG. 14. For a magnetic field generating unit 472 of the same outer dimension as the arrangement of FIG. 14, there are fewer cross-pieces; the result in the example shown is that there are two apertures, for example, rather than the six of the arrangement depicted in FIG. 14. At least each coil element 483 comprises a coil configured to generate a magnetic field directed along a direction such as an axis of the coil (e.g., vertically upwards or downwards in the plane of the page in the orientation of the figure). The magnetic field thus deflects primary beams with paths through the gaps between the adjacent coil elements 483. However, the deflection is in two-dimensional groups (for example each group is a beam arrangement that is a two dimensional array) rather than one-dimensional groups (for example each group being a one-dimensional array, i.e. a line such as a row or column). Terminating members (comprising end pieces) 484 provide a return path for the magnetic flux; that is, the terminating members 484 complete one or more magnetic circuits in the magnetic component, with the coil elements 483.

Figure 17:
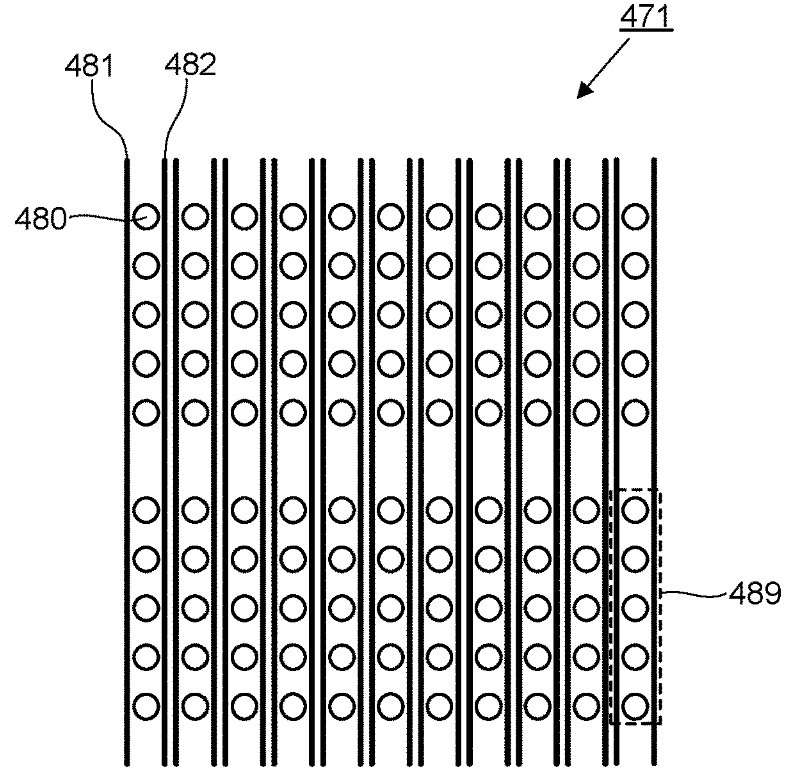
FIG. 17 is a schematic diagram illustrating an exemplary electric field generating unit configured to operate in conjunction with the magnetic field generating unit of FIG. 16.

An example of an electric field generating unit 471 configured to operate in conjunction with the magnetic field generating unit 472 of FIG. 16 to provide the Wien filter arrangement (comprising the Wien filter elements) is shown in FIG. 17. FIG. 17 is a schematic sectional view relative to plane A-A in FIG. 12 through the electrostatic component. The arrangement depicted in FIG. 17 corresponds to the arrangement of FIG. 13, but featuring smaller gaps between the electrodes 481, 482 to account for the more density spaced beams. That is, the density of electrodes across the beam arrangement is higher (as is the beam density in the beam arrangement) than in the arrangement depicted and described with reference to FIG. 13. For a beam arrangement of the same cross-sectional dimensions (or an electric field generating unit 471 of the same cross-sectional dimensions) the electrodes of the arrangement depicted in FIG. 17 are spaced apart with a smaller dimension than the electrodes of the arrangement depicted in FIG. 13; that is the electrodes of the arrangement shown in FIG. 17 are closer together. A Wien filter having the combination of the magnetic component and electrostatic components with respective arrangements of FIGS. 16 and 17 would provide a Wien filter array in which each Wien filter element acts on signal particles generated by a group of beams paths in a line such as single row of five beam paths (an example of which is labelled 489 in FIGS. 16 and 17). Such a group of beam paths are in a line, for example a column aligned parallel to the magnetic field of the Wien filter element (thus the line of beam paths is perpendicular to a deflection force applied by the Wien filter element to signal particles).

Figure 18:
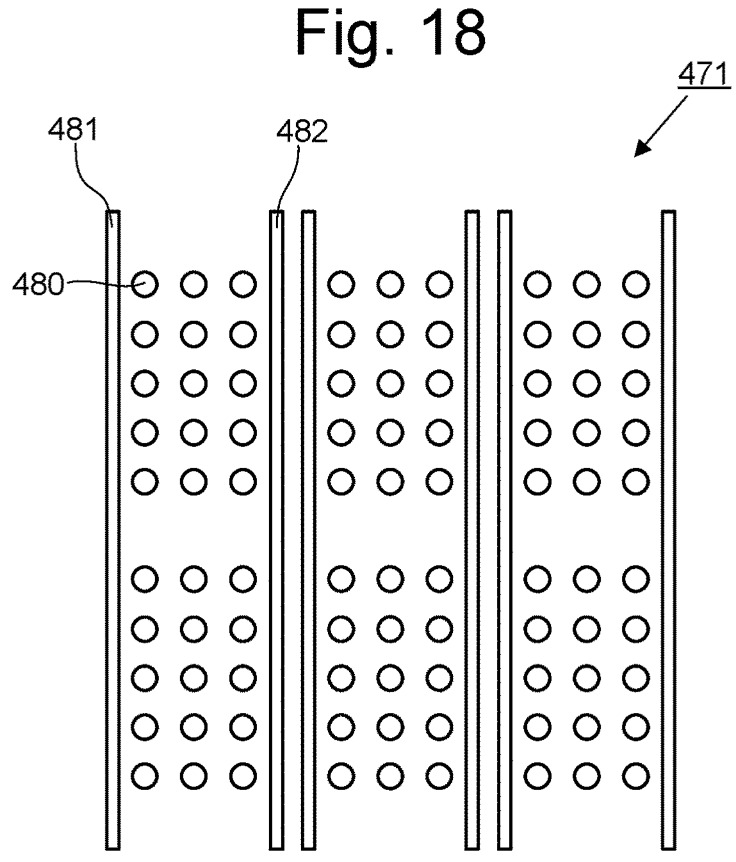
FIG. 18 is a schematic diagram illustrating an alternative configuration of the electric field generating unit in which electrodes of opposite polarity are spaced further apart than in FIG. 17.

FIG. 18 depicts an alternative configuration of the electric field generating unit 471 in which the electrodes 481, 482 of opposite polarity to each other, for example facing each other, are spaced further apart than in FIG. 17. When combined with the magnetic field generating unit 472 of FIG. 16, as depicted schematically by broken lines in FIG. 19, a Wien filter arrangement with a Wien filter array is provided. Each Wien filter element of the Wien filter array acts on signal particles generated by a group of beams arranged in three lines (or rows) of five beam paths. Alternatively, the group is five lines (or columns) of three beam paths. Each row is aligned parallel to the magnetic field of a respective Wien filter element. The pattern formed by the paths of the beams in the groups of beams is depicted schematically in FIG. 20. In this example, each Wien filter element thus acts on signal particles from a two-dimensional sub-array of the primary beams. Arranging for each Wien filter element to act on a two-dimensional sub-array in this manner reduces the number of independent Wien filter elements required and/or the number of apertures in the Wien filter and its constituent electrostatic component and magnetic component. The apertures can be larger than they would otherwise be by having such a two-dimensional sub-array per aperture. Further, such an arrangement permits more material to be used in the core body enabling the magnetic component to have sufficient flux density for a suitable performance specification of the Wien filter arrangement and its Wien filter elements. Such an arrangement thereby facilitates space saving in the vicinity of the Wien filter arrangement and may enable a Wien filter arrangement of improved functional specification.

The paths of the primary beams intersect a plane orthogonal to the paths in a pattern. In FIGS. 13-20, the pattern corresponds to the distribution of circles 480 (each of which represent one beam). The pattern may be described in terms of beams areas 491 and non-beam areas 492, as exemplified in FIG. 20. Each beam area 491 contains a grid of paths of beams corresponding to a position of a respective aperture 485 defined by the Wien filter array (see FIG. 19 for the apertures 485 corresponding to the beam areas 491 of FIG. 20). The grid of paths of beams in a beam area is an example of a pattern of a group of beams of the beam arrangement. The group of beams in the grid of paths of beams is the sub-array of the beam arrangement. Each non-beam area 492 corresponds to a body element of the Wien filter array. Preferably the non-beam areas correspond to a position in the Wien filter arrangement of a mechanical component of the Wien filter arrangement such as the magnetic component. Thus a body element may comprise an element of the core body such as a coil element 483 or a terminating member 484. The non-beam areas 492 shown in FIG. 20 correspond to the positions of the coil elements 483 and terminating members 484 shown in FIG. 19. Such a mechanical component may in addition or in the alternative be the electrostatic component, such that a body element may be defined between electrodes of adjacent gaps or even apertures for example that face in opposite directions (i.e. without a line of beam paths therebetween) and for example structural elements therebetween. Such structural elements may be between the electrodes and for example provide mechanical structure and support to the electrodes. Such non-beam areas 492 shown in FIG. 20 may correspond to the adjacent and opposing electrodes 481 and 482; that is also the volume between the adjacent electrodes e.g. without a line of beam paths therebetween.

Figure 19:
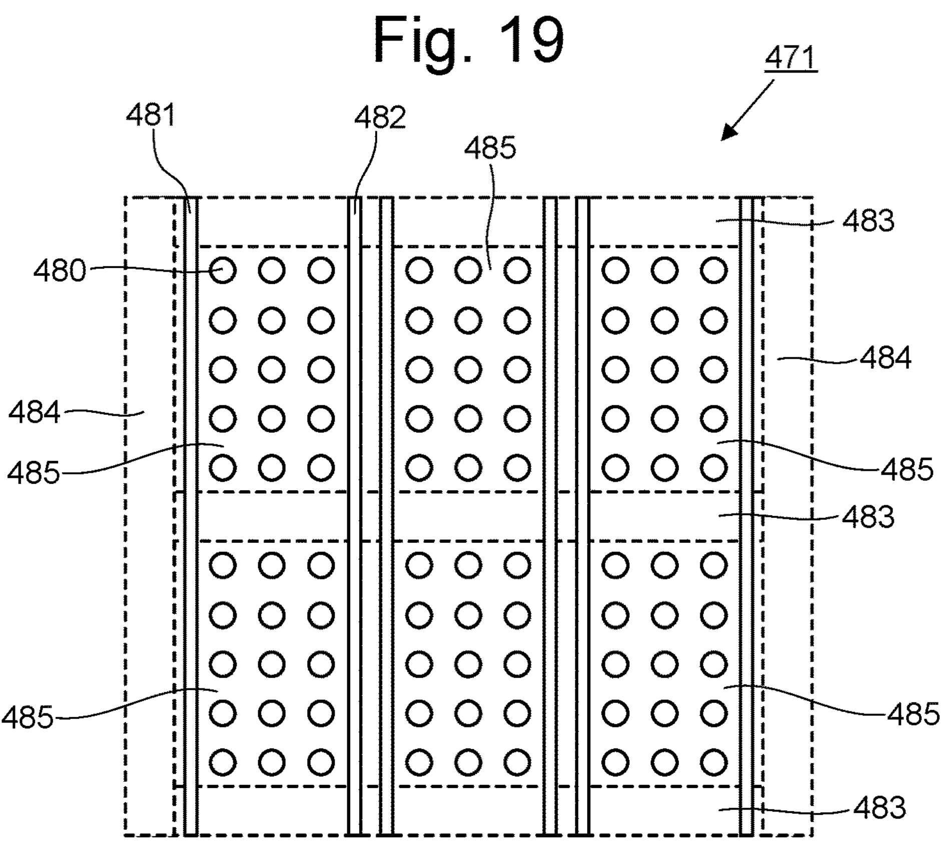
FIG. 19 is a version of FIG. 18 with positions of the coil elements of FIG. 16 shown in broken lines.
Figure 20:
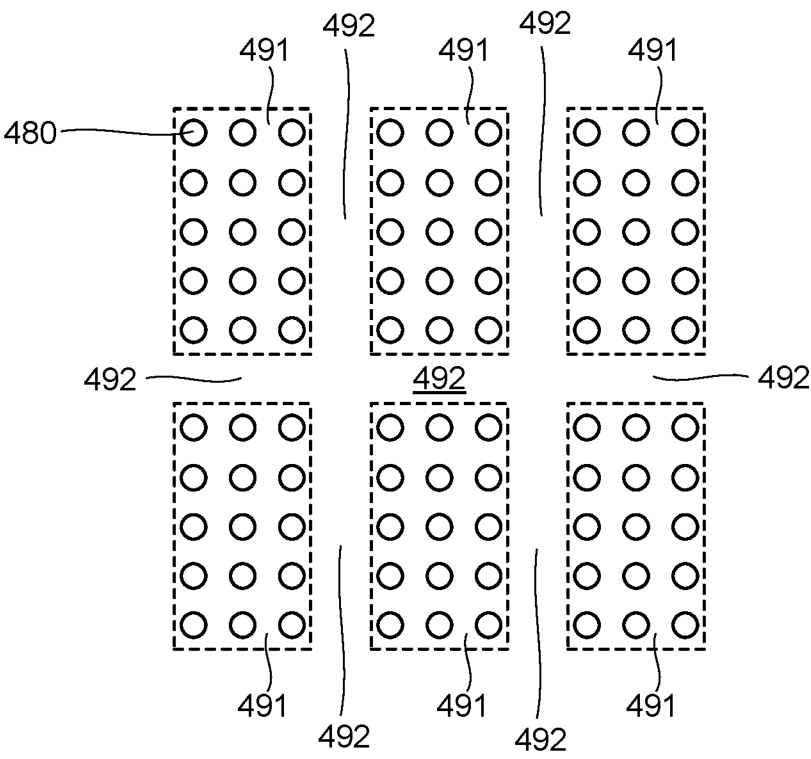
FIG. 20 is a schematic diagram illustrating a pattern formed by groups of beams passing through Wien filter element apertures shown in FIG. 19.
Figure 21:
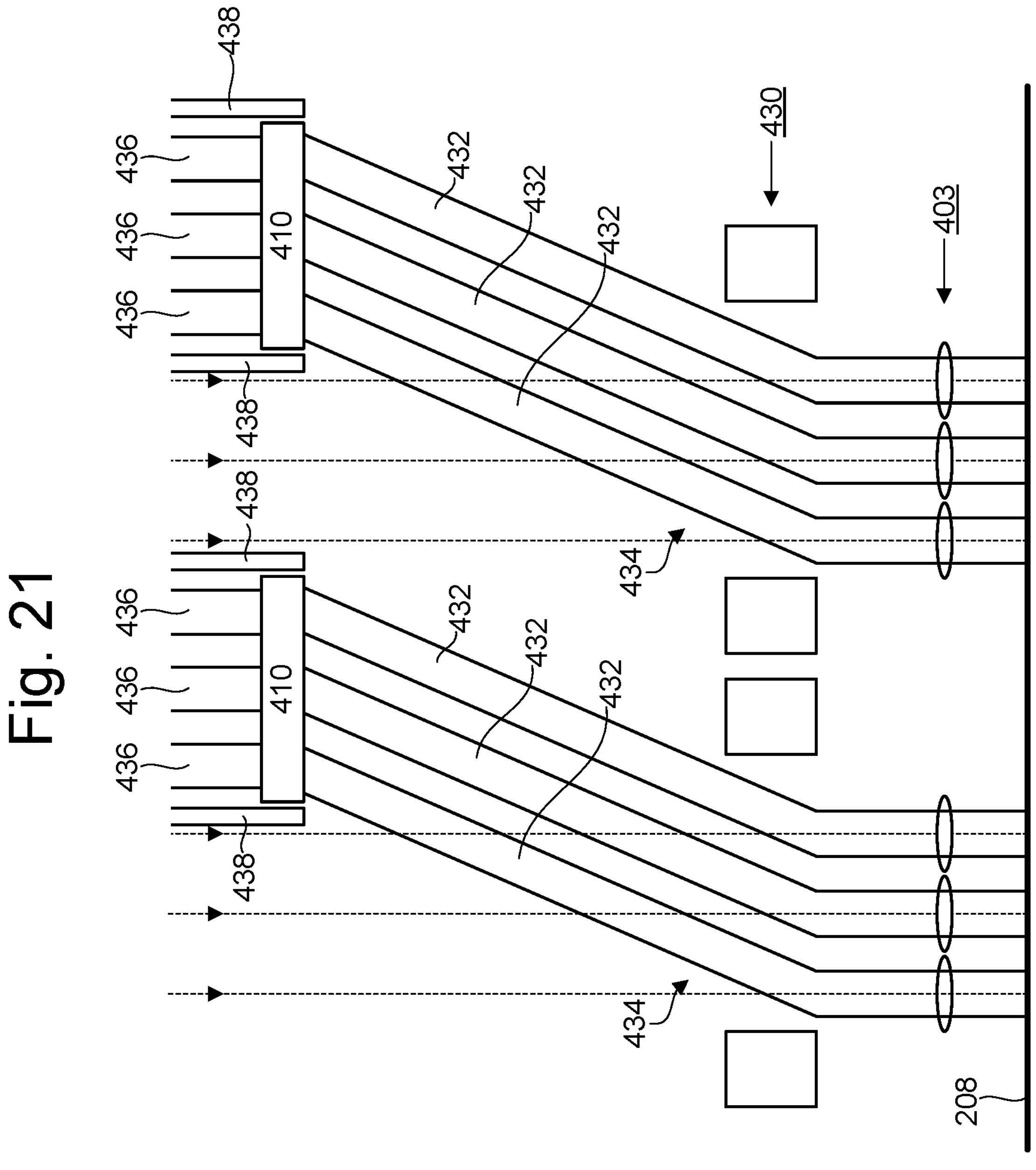
FIG. 21 is a schematic diagram illustrating a portion of an electron-optical column in which Wien filter elements act on two-dimensional sub-arrays of beams.

An example arrangement using the Wien filter array of FIGS. 18-20 is depicted in FIG. 21. Primary beam paths are indicated by broken lines. As described above, each Wien filter acts on three rows of beams. In the example shown, the column comprises optical fibers 436 configured to guide light from the scintillators 410 to a remote light sensor (not shown). The column further comprises one or more shields 438 between the optical fibers 410 and the paths of the beams. The shields 438 prevent the primary beams from being affected by accumulation of charge on the optical fibers 436. Arranging for each Wien filter element to act on a two-dimensional sub-array reduces the total amount of shielding relative to arrangements where the Wien filter elements each act on single rows or single beams, and therefore further reduces space requirements.

In a variation on the arrangement of FIG. 21, the column comprises a light guiding arrangement with a mirror 414, as described above with reference to FIGS. 8-11, instead of the optical fibers 436, thereby achieving further space savings.

Use of a Wien filter may introduce or contribute to aberrations. The aberrations may result in imperfect alignment of the plurality of beams with respective to the objective lens array 403 for example. In the arrangements described below, such aberrations are reduced or removed by providing one or more corrector arrays 440. The corrector arrays 440 are configured to improve alignment of the beams with the objective lens array 403 and/or collimator 402.

Figures 22, 23:
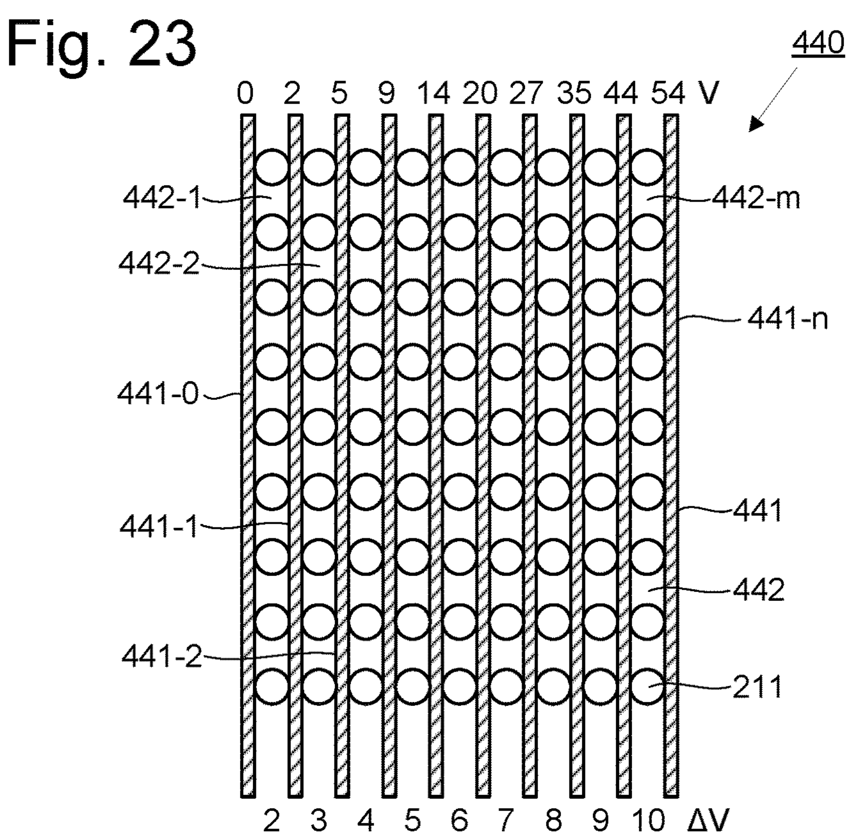
FIG. 22 is a schematic top view of an example corrector array comprising a plurality of elongate electrodes configured to operate in a differential mode.
FIG. 23 is a schematic top view of an example corrector array comprising a plurality of elongate electrodes configured to operate in a cumulative mode.

As exemplified in FIGS. 22 and 23, a corrector array 440 may comprise a slit deflector. It is noted that the corrector array 440 is similar structurally to the arrangement of the electric field generating unit 471 shown and described with respect to FIG. 13. The same structural description applies except as stated differently here; the functional and operational details may be different, for example as herein described. The variations described with respect to FIG. 13 may also apply. For example, the spacings between facing electrodes of one line of beam paths may be different, for example there may be more the one line of beam paths between facing electrodes, such as shown in and described with respect to FIG. 18. The distances between the electrodes may be of a different density for example further apart or closer together, for example as depicted in and described with respect to FIG. 17. A slit deflector is an example of a manipulator and may also be referred to and used as a slit corrector. The slit deflector may comprise an array of elongate electrodes 441, e.g., parallel plates or parallel strips, defining an array of slits 442. Electrodes 441 may be formed of silicon or a metal, for example doped silicon regions of a substrate and metallization layers formed on a substrate. Silicon electrodes can be formed by selective etching of a silicon wafer.

The elongate electrodes 441 may extend substantially perpendicularly to paths of a first plurality of the beams 211 of charged particles and be arranged such that a second plurality of beams 211 propagate between a pair of the elongate electrodes 441. The second plurality of beams 211 is a subset of the first plurality of beams 211. The second plurality of beams 211 may be arranged along a straight line for example, the straight line being interposed between a pair of the elongate electrodes 441.

The array of elongate electrodes 441 may comprise a plurality of the pairs of elongate electrodes 441 arranged such that a respective second plurality of beams 211 propagates between each pair of elongate electrodes 441. The column applies a respective potential difference between each pair of elongate electrodes 441. The elongate electrodes 441 may comprise parallel plates extending parallel to the direction of propagation of the second plurality of beams 211.

Applying a potential difference between the electrodes 441 causes a deflection of the beams. The direction of the deflection is determined by the relative polarity of the potential difference. The magnitude of the deflection is determined by the magnitude of the potential difference, the distance between the electrodes 441 and the depth of the electrodes in the direction parallel to the propagation of the beams.

In an embodiment, the electrodes 441 define an array of parallel slits 442. Each of the beams 211 passes through one of the slits 442. Thus, facing elongate surfaces of the respective elongate electrodes 441 define a corresponding slit 442. Desirably the potentials applied to each electrode surface are individually controllable so that the deflection can be controlled as a function of beam position in a direction perpendicular to the longitudinal direction of the slits 442. In an embodiment a predetermined set of voltages are applied to the electrodes to provide a predetermined set of deflections. For example, if the slits 442 extend along a Y axis of a Cartesian coordinate system (i.e., the elongate direction of the electrodes 441 is in a Y direction), deflection can be controlled as a function of beam position in an X direction.

In an embodiment, each slit 442 is defined by two dedicated electrodes 441. The two dedicated electrodes 441 act on beams passing through the slit 442; thus the two dedicated electrodes do not operate on any other beams. Each of the electrodes 411 in such an arrangement may thus have beams 211 adjacent only one side of the electrodes 411. This mode of operation may be referred to as a differential mode. In the example of FIG. 22, slit 442-1 is defined by opposing surfaces of the electrodes 441-1 and 441-2, slit 442-2 is defined by opposing surfaces of electrodes 441-3 and 441-4 (not marked), etc. so that slit 442-*m* is defined by electrodes 441-(2*m*-1) and 441-2*m*. Opposite potentials are applied to alternate (adjacent) electrodes 441, for example odd-numbered electrodes 441 are negative and even numbered electrodes 441 are positive. The magnitudes of the applied potentials can be varied with position to provide a desired deflection that varies with position in the direction perpendicular to the length of the electrodes 441. For example, as shown in FIG. 22, the potentials (indicated at the top of the figure) increase linearly and the potential differences (indicated at the bottom of the figure) likewise increase linearly. For example, one set of electrodes, e.g. the even ones, can be kept at a constant potential, e.g. ground.

In an alternate embodiment, each electrode (except for the electrodes at the end of the array) serves to define one side of each of two slits 442. Some of the elongate electrodes 441 thus have beams adjacent both sides thereof. In such arrangements, opposite surfaces of the electrodes 441 extending in the direction of the beam paths define in part adjoining slits 442. For example, as shown in FIG. 23, slit 442-1 is defined by the surfaces of electrodes 441-0 and 441-1, slit 442-2 is defined by facing surfaces of electrodes 441-1 and 441-2, etc., so that slit 442-*n* is defined by the surfaces of electrodes 441-(*n*−1) and 441-*n*. In such an arrangement, the potential applied to electrode 441-*n* relative to the potential applied to electrode 411-0 is the sum of the potential differences applied across slits 442-1 to 442-*n*. This mode of operation may therefore be referred to as a cumulative mode. A linear increase in potential differences results in the absolute potentials applied to the electrodes increasing more quickly than linear. In general, in an arrangement as shown in FIG. 23 the potential differences increase monotonically across the array. Variations of the arrangement described with respect to and depicted in FIG. 23 may have the electrodes spaced apart a different distance, e.g. of a different pitch, such as closer together or further apart. For example in arrangements in which the electrodes are further apart, there may be more than one line of beam paths between adjacent electrodes; for example multiple columns of beams may be provided between adjacent facing electrodes, such as in any such manner described herein with reference to FIG. 18.

An advantage of the arrangement of FIG. 22, compared to that of FIG. 23, is that the magnitudes of the potentials applied to the electrodes need be no greater than the potential differences required to achieve the desired deflections. An advantage of the arrangement of FIG. 23, compared to that of FIG. 22, is that fewer electrodes are required so that the corrector can be made more compact.

In an embodiment, a plurality of slit deflectors are provided adjacently in the beam propagation direction. Such an arrangement may be referred to as a stack of slit deflectors. The slit deflectors in a stack are differently oriented. For example the stack of slit deflectors may comprise two arrays of slits that are positioned along the beam path. The orientation of the slits in one of the arrays may be angled, for example orthogonal, relative to the orientation of the slits in the other array. See for example the disclosure of European patent application 20156253.5 filed on 7 Feb. 2020 which is hereby incorporated by reference so far as the slit deflectors and arrangements with multiple slit deflectors.

In a different embodiment of corrector array 440, the corrector array 440 may be a corrector electrode either as a monolithic electrode or as an array and may be associated with one or both of adjoining electrodes of a lens array, between the adjoining lens array electrodes. The lens array electrodes may be of a lens array such as an objective lens array, a condenser lens array or a collimating lens array. In a corrector electrode are apertures for the beam paths of the beam arrangement. The apertures in the corrector electrode are aligned with apertures in the adjoining electrodes of the lens array. In an arrangement, the corrector electrode may be portioned into a number of portions, for example as an array of similar tessellations, having a pattern in plan view with respect to the beam path, for example in a grid of rectangular elements or strips. In each portion is defined one or more apertures for the beam paths of the beam arrangement, preferably a plurality of apertures. Each portion may be individually and/or independently controllable to adjust the lenses associated with the portion in the lens array. Control of the corrector electrodes of this embodiment of corrector may help reduce the aberrations in the beams of the beam arrangement when reaching the sample. Such a corrector is disclosed in the European patent application number 20168281.2 filed on 6 Aug. 2020 which is incorporated by reference so far as the disclosure of such an aperture assembly featuring correctors in between electrodes of a lens array. Use of an array of such a corrector electrode enables corrections of aberrations and errors within a corresponding group of beams of the beam arrangement.

Additionally or alternatively, the corrector array 440 may comprise one or more plates defining apertures that each have their own electrode, for example with an array of electrodes around their perimeter. Such a corrector array 440 may be capable of independently applying different corrections to different beams via each respective aperture. The corrector array 440 may comprise a plurality of individually programmable deflectors as disclosed in EP2702595A1 or an array of multipole deflectors as disclosed EP2715768A2, of which the descriptions of the beamlet manipulators in both documents are hereby incorporated by reference. Use of such a corrector array 440 enables corrections of aberrations and errors within specific beams of the beam arrangement.

In some arrangements in which the aperture array 401 is up-beam of the collimator 402, as exemplified in FIG. 3, the column comprises a corrector array 440 integrated with, or directly adjacent to, the aperture array 401. The corrector array 440 may be positioned up-beam or down-beam of the aperture array 401. Such a corrector array 440 may be configured to improve alignment of the beams with the collimator 402. The corrector array 440 may be implemented as described above with reference to FIG. 22 or FIG. 23 (i.e. using a strip deflector operating in the differential mode or the cumulative mode). However, the arrangement of FIG. 23 may be preferred because it is more compact than the arrangement of FIG. 22. Compactness is particularly desirable for a corrector array 440 positioned close to the aperture array 401 because the beams are closer together at this location than further down-beam.

In some arrangements, as exemplified in FIG. 3, the column comprises a corrector array 440 integrated with, or directly adjacent to, the collimator 402. The corrector array 440 may be positioned up-beam or down-beam of the collimator 402. Such a corrector array 440 may be configured to improve alignment of the beams with the objective lens array 403. The approach of using a corrector array 440 comprising plates defining apertures having their own electrodes may be particularly appropriate for this location. The ability to tune each beam separately may allow a fine correction of alignment of beams with the objective lens array 403 to be applied. Alternatively or additionally, the corrector array 440 may be implemented as described above with reference to FIG. 22 or FIG. 23, optionally to provide a coarse correction of alignment of beams with the objective lens array 403.

The corrector array 440 thus may be incorporated in the electron-optical element in which the aberrations are induced. For example incorporation of the corrector array 440 in the objective lens array 403 can compensate for or correct aberrations induced in the objective lens array 403. Thus incorporation of a corrector array 440 in the collimator 402 can compensate for or correct aberrations induced in the electron beams in the collimator 402. Further, a corrector array 440 integrated into or associated with the objective lens array 403 may correct for aberrations induced into the electron beams by an up-beam electron-optical element such as the collimator 402. Similarly a corrector integrated into or associated with the collimator 403 may compensate for aberrations generated in the beams of the beam arrangement by an electron-optical component down-beam of the collimator 403, such as by the objective lens array 403. Use of the corrector array 440 for such correction, i.e. anticipatory compensation and/or later correction, can compensate and/or correct aberrations generated in the path of the beams of the beam arrangement.

The Wien filter arrangement is such a source of aberrations created in the beams of the beam arrangement. A corrector array 440 may be located in or associated with an electron-optical element such a collimator 402 (and/or condenser lens array) up-beam of the Wien filter arrangement (i.e. the Wien filter array). In principle the corrector array 440 may be located at any position along the beam path; however there are positions along the beam path that are preferred.

Such a corrector array 440 compensates for aberrations generated down-beam in the beams of the beam array by the Wien filter arrangement. Additionally or alternatively a corrector array 440 is located in or associated with an electron-optical element such as an objective lens array 403. Such a corrector array 440 can correct for aberrations in the beams of the beam arrangement caused by the Wien filter arrangement. However, having correction of Wien filter sourced aberrations in an objective lens array 403 may be less desirable. Aberrations caused in the beams by action of the Wien filter arrangement include misalignment of the beam arrangement with the objective lens array 403. The misalignment of the beams with the objective lens array 403 is caused by deflection of the beams in undesired ways. The beams do not enter the objective lenses at the desired positions.

For the corrector array 440 to correct such misalignment aberrations, (so that the beams of the beam arrangement are aligned with the objective lens array 403 and enter the objective lenses at the respective intended positions), it is desirable for the corrector array 440, for example operating as an alignment corrector, to be spaced away from the position along the beam path at which alignment is sought. However, it is desirable for the corrector array 440 to be further away, along the beam path. At such a position spaced apart from the position at which alignment is sought, e.g. the objective lens array 403, the corrector array 440 deflects the beams a smaller angle than if the corrector array 440 were closer to the position along the beam path at which alignment is sought, e.g. the objective lens array 403. That is because the beam is shifted in the plane at which alignment is sought equal to the angle the corrector makes multiplied by the distance between corrector and the plane at which alignment is sought. A smaller angle of deflection is likely to induce fewer or smaller aberrations and a correction made with a smaller angle is likely to be of increased accuracy. Most desirably the corrector array 440 is proximate or even adjacent the Wien filter arrangement along the beam path of the beam arrangement. In principle the corrector array 440 is preferably sufficiently far away from and up-beam of the objective lens array 403 that the angle effected by the correction of the beam paths achieves alignment of the beam of the beam arrangement with the objective lens array 403.

Placing a corrector array 440 adjacent to the Wien filter arrangement, for example up beam or down beam of the Wien filter arrangement, is desirable because correcting aberrations close to their source prevents the beam being shifted laterally by the corrector array 440. Having the corrector array 440 closely positioned relative to the Wien filter arrangement is desirable because it enables having smaller apertures in the corrector array 440, and having a stronger corrector. This is because the beams of the beam arrangement have smaller cross-section at the Wien filter arrangement. Fewer or smaller aberrations are likely to be induced in a beam of smaller cross-section, enabling a greater field strength to be applied to such a beam than a beam of larger cross-section for the beam to meet required specifications and tolerances.

Although the corrector array 440 is preferably placed close to the Wien filter arrangement, it should not be positioned within the Wien filter arrangement, such as between the electrostatic and magnetic components of the Wien filter arrangement. This is because the corrector array 440 may interfere with the fields, especially the electrostatic fields, within the Wien filter arrangement. Having the corrector array 440 in a location without electrostatic fields, such as outside the Wien filter arrangement, is desirable because otherwise these fields would be changed by the presence of the corrector.

The paths of signal particles from the sample pass through the Wien filter arrangement. Therefore, the position of the corrector array 440 should account for the influence the corrector has on the paths of the signal particles. Such positions of the corrector array 440 at which the corrector array 440 may influence the paths of the signal particles include a position down beam of the Wien filter arrangement and up beam of the Wien filter arrangement, at least so far as the detector for the signal particles. Although correctors can be placed up beam of the detector (located above the Wien filter arrangement), it is preferable to avoid having the corrector array 440 between the Wien filter arrangement and the detector array because of possible interference of the correctors with the path of the signal particles, for example in operating on the path of the signal particles and/or in volume conflict (such as the corrector blocking the path of the signal particles).

Therefore preferred positions for the corrector array 440 may be above the detector array and below the Wien filter arrangement. A corrector array 440 above the detector array operates on the beams of the beam arrangement. Whereas a corrector array 440 below the Wien filter arrangement operates on the paths of both the beam arrangement and the paths of the signal particles, a corrector operating only on the beam arrangement (i.e. and not the signal particles) is advantageous for aligning the beams of the beam arrangement to something such as the objective lens array 403, independently of the paths the signal particles. An arrangement may have two corrector arrays 440: a corrector array 440 up beam of the detector array and a corrector array 440 down beam of the Wien filter arrangement. The corrector arrays 440 may be controllably connected. Such an arrangement provides a correction capability with two degrees of freedom, for example: aligning the beam arrangement and aligning the beam paths of the signal particles independently of each other and/or with respect to different electron-optical components. For example the alignment of the paths of the signal particles may be aligned with respect to the detector elements of a detector array whilst maintaining the alignment of the beam paths of the beam arrangement to the objective lens array 403 and vice versa.

References to upper and lower, up and down, above and below, horizontal and vertical etc. in relation to the embodiments disclosed should be understood as referring to directions parallel to the (typically but not always vertical) up-beam and down-beam directions of the electron beam or multi-beam impinging on the sample 208. Thus, references to up beam and down beam are intended to refer to directions in respect of the beam path independently of any present gravitational field.

The embodiments herein described may take the form of a series of aperture arrays or electron-optical elements arranged in arrays along a beam or a multi-beam path. Such electron-optical elements may be electrostatic. In an embodiment all the electron-optical elements, for example from a beam limiting aperture array to a last electron-optical element in a sub-beam path before a sample, may be electrostatic and/or may be in the form of an aperture array or a plate array. In some arrangements one or more of the electron-optical elements are manufactured as a microelectromechanical system (MEMS) (i.e. using MEMS manufacturing techniques). Electron-optical elements may have magnetic elements and electrostatic elements. For example, a compound array lens may feature a macro magnetic lens encompassing the multi-beam path with an upper and lower pole plate within the magnetic lens and arranged along the multi-beam path. In the pole plates may be an array of apertures for the beam paths of the multi-beam. Electrodes may be present above, below or between the pole plates to control and optimize the electromagnetic field of the compound lens array.

Where electrodes or other elements are provided that can be set to different potentials relative to each other it will be understood that such electrodes/elements will be electrically isolated from each other. If the electrodes/elements are mechanically connected to each other, electrically insulating connectors may be provided. For example, where electrodes/elements are provided as a series of conductive plates that each define an aperture array, for example to form an objective lens array or control lens array, electrically insulating plates may be provided between the conductive plates. The insulating plates may be connected to the conductive plates and thereby act as insulating connectors. The conductive plates may be separated from each other along sub-beam paths by the insulating plates.

An assessment tool or assessment system according to the disclosure may comprise apparatus which makes a qualitative assessment of a sample (e.g. pass/fail), one which makes a quantitative measurement (e.g. the size of a feature) of a sample or one which generates an image of map of a sample. Examples of assessment tools or systems are inspection tools (e.g. for identifying defects), review tools (e.g. for classifying defects) and metrology tools, or tools capable of performing any combination of assessment functionalities associated with inspection tools, review tools, or metrology tools (e.g. metro-inspection tools).

Reference to a component or system of components or elements being controllable to manipulate a charged particle beam in a certain manner includes configuring a controller or control system or control unit to control the component to manipulate the charged particle beam in the manner described, as well optionally using other controllers or devices (e.g. voltage supplies) to control the component to manipulate the charged particle beam in this manner. For example, a voltage supply may be electrically connected to one or more components to apply potentials to the components, such as to the electrodes of the control lens array 250 and objective lens array 241, under the control of the controller or control system or control unit. An actuatable component, such as a stage, may be controllable to actuate and thus move relative to another components such as the beam path using one or more controllers, control systems, or control units to control the actuation of the component.

Functionality provided by the controller or control system or control unit may be computer-implemented. Any suitable combination of elements may be used to provide the required functionality, including for example CPUs, RAM, SSDs, motherboards, network connections, firmware, software, and/or other elements known in the art that allow the required computing operations to be performed. The required computing operations may be defined by one or more computer programs. The one or more computer programs may be provided in the form of media, optionally non-transitory media, storing computer readable instructions. When the computer readable instructions are read by the computer, the computer performs the required method steps. The computer may consist of a self-contained unit or a distributed computing system having plural different computers connected to each other via a network.

The terms "sub-beam" and "beamlet" are used interchangeably herein and are both understood to encompass any radiation beam derived from a parent radiation beam by dividing or splitting the parent radiation beam. The term "manipulator" is used to encompass any element which affects the path of a sub-beam or beamlet, such as a lens or deflector. References to elements being aligned along a beam path or sub-beam path are understood to mean that the respective elements are positioned along the beam path or sub-beam path. References to optics are understood to mean electron-optics.

There are provided a number of clauses. Clause 1: A charged-particle optical device configured to project a plurality of beams of charged particles to a sample, the device comprising a charged particle column and a light sensor, the charged particle column comprising: an objective lens array configured to project the plurality of beams towards the sample and comprising a plurality of electrodes arranged along a path of the plurality of beams; a plurality of scintillators configured to receive signal particles emitted from the sample and to generate light in response to the received signal particles; and a light guiding arrangement, wherein the light sensor is configured to detect the light generated by the scintillators and the light guiding arrangement is configured to guide the light generated by the scintillators to the light sensor, the light guiding arrangement comprising a mirror defining a plurality of apertures to allow/for passage of the plurality of beams through the mirror towards the sample.

Clause 2: The device of clause 1, wherein each aperture of the mirror corresponds to a respective one or more beams of the plurality of beams.

Clause 3: The device of clause 1 or 2, wherein the scintillators are arranged in an array.

Clause 4: The device of clause 3, wherein the array is orthogonal to the path of the plurality of beams.

Clause 5: The device of clause 3 or 4, wherein the array comprises a two-dimensional pattern, preferably in the form of a grid.

Clause 6: The device of any preceding clause, wherein the scintillators are positioned up-beam of at least one of the electrodes of the objective lens array.

Clause 7: The device of any preceding clause, wherein at least one of the electrodes of the objective lens array faces the sample.

Clause 8: The device of any preceding clause, wherein each scintillator surrounds an aperture configured to allow passage of a respective one or more of the plurality of beams.

Clause 9: The device of any preceding clause, wherein the scintillators are supported by one of the electrodes of the objective lens array.

Clause 10: The device of any preceding clause, wherein at least part of the light guiding arrangement and the objective lens array are structurally connected, preferably with a support for the mirror being structurally connected to and/or supporting at least a most proximate electrode of the objective lens array.

Clause 11: The device of any preceding clause, wherein the scintillators are positioned up-beam of the objective lens array.

Clause 12: The device of any preceding clause, wherein the scintillators are arranged in an array interleaved between paths of the beams.

Clause 13: The device of any preceding clause, wherein the scintillators are arranged in an array with each scintillator displaced relative to a path of a corresponding beam of the plurality of beams.

Clause 14: The device of any preceding clause, wherein the scintillators are provided as scintillator elements each associated with one or more beams of the plurality of beams, preferably as a monolithic scintillator in which a plurality of apertures are defined, each aperture corresponding to a respective one or more beams of the plurality of beams.

Clause 15: The device of any preceding clause, wherein the scintillators are arranged in an array of strips, each strip corresponding to a group of beams of the plurality of beams, preferably wherein the plurality of beams comprises a plurality of rows of beams and each group corresponds to a respective row.

Clause 16: The device of any preceding clause, wherein the column further comprises a Wien filter arrangement configured to apply a deflection force to deflect signal particles toward the scintillators.

Clause 17: The device of clause 16, wherein the Wien filter arrangement comprises a Wien filter array, each Wien filter element in the Wien filter array being configured to act on signal particles generated by a different respective group of the beams.

Clause 18: The device of clause 17, wherein each group of beams comprises a row of beams, the row extending perpendicularly or obliquely to a direction of action of each Wien filter element in the Wien filter array on the signal particles, the action preferably being a deflection force.

Clause 19: A charged-particle optical device configured to project a plurality of beams of charged particles to a sample, the device comprising: an objective lens array configured to project the plurality of beams towards the sample and comprising a plurality of electrodes arranged along a path of the plurality of beams; a detector comprising detector elements configured to receive signal particles emitted from the sample; and a Wien filter array configured to apply a deflection force to deflect signal particles towards the detector elements, each Wien filter element of the Wien filter array being configured to act on signal particles generated by a different respective group of the beams, wherein each group of beams comprises a row of the beams, the row extending perpendicularly or obliquely to a direction of the deflection force.

Clause 20: The device of clause 18 or 19, wherein each group of beams comprises a plurality of the rows of beams.

Clause 21: The device of any of clauses 17-20, wherein each Wien filter element of the Wien filter array defines a single aperture containing paths of all of the beams of a respective group, preferably sized to exclude the paths of beams from all other groups.

Clause 22: The device of any of clauses 17-21, wherein the groups of beams comprise plural groups aligned in series in the direction of the rows of beams.

Clause 23: The device of any of clauses 17-22, wherein the paths of the plurality of beams intersect a plane orthogonal to the paths in a pattern, the pattern has beams areas and non-beam areas, each beam area contains a grid of paths of beams corresponding to a position of a respective aperture defined by the Wien filter array, and each non-beam area corresponds to a body element of the Wien filter array.

Clause 24: The device of any preceding clause, further comprising one or more corrector arrays configured to improve alignment of the beams with the objective lens array.

Clause 25: A charged-particle optical device configured to project a plurality of beams of charged particles to a sample, the device comprising: an aperture array configured to generate the plurality of beams from a source beam incident on the aperture array; a collimator configured to collimate paths of the beams; an objective lens array configured to project the beams onto the sample and comprising a plurality of electrodes arranged along a path of the plurality of beams; a detector comprising detector elements configured to receive signal particles emitted from the sample; a Wien filter arrangement configured to deflect signal particles towards the detector elements; and one or more corrector arrays configured to improve alignment of the beams with the objective lens array and/or collimator.

Clause 26: The device of clause 25, wherein the Wien filter arrangement is between the objective lens array and the collimator.

Clause 27: The device of clause 25 or 26, wherein: the aperture array is up-beam of the collimator; and the one or more corrector arrays comprises a corrector array integrated with, or directly adjacent to, the aperture array and configured to improve alignment of the beams with the collimator.

Clause 28: The device of any of clauses 25-27, wherein the one or more corrector arrays comprises a corrector array integrated with, or directly adjacent to, the collimator and configured to improve alignment of the beams with the objective lens array.

Clause 29: The device of any of clauses 24-28, wherein: the corrector array comprises an array of elongate electrodes, the elongate electrodes extending substantially perpendicular to paths of a first plurality of the beams and arranged such that a second plurality of the beams propagate between a pair of the elongate electrodes, preferably the elongate electrodes of the pair of the elongate electrodes facing each other, the second plurality of beams being a subset of the first plurality of beams; and the column is configured to apply a potential difference between the pair of elongate electrodes so as to deflect the second plurality of beams.

Clause 30: The device of clause 29, wherein: the array of elongate electrodes comprises a plurality of pairs of elongate electrodes arranged such that a respective second plurality of beams propagates between each pair of elongate electrodes, preferably the elongate electrodes of the pair of the elongate electrodes facing each other; and the device is configured to apply a respective potential difference between each pair of elongate electrodes.

Clause 31: The device of clause 30, configured such that each of the elongate electrodes has beams adjacent only one side thereof.

Clause 32: The device of clause 31, configured to apply potentials of opposite polarities to adjacent elongate electrodes.

Clause 33: The device of clause 30, configured such that some of the elongate electrodes have beams adjacent both sides thereof.

Clause 34: The device of clause 33, configured such that the potential applied to each of the elongate electrodes is given by a continually, e.g. monotonically, increasing function of position across the array of elongate electrodes.

Clause 35: The device of any of clauses 29-34, wherein the elongate electrodes comprise parallel plates extending parallel to the direction of propagation of the second plurality of beams.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims and the clauses disclosed herein.

The invention claimed is:

1. A charged-particle optical device configured to project a plurality of beams of charged particles to a sample, the device comprising a charged particle column and a light sensor, the charged particle column comprising:

an objective lens array configured to project the plurality of beams towards the sample and comprising a plurality of electrodes arranged along a path of the plurality of beams;

a plurality of scintillators configured to receive signal particles emitted from the sample and to generate light in response to the received signal particles; and a light guiding arrangement configured to guide the light generated by the scintillators to the light sensor for detection by the light sensor, the light guiding arrangement comprising a mirror defining a plurality of apertures to allow for passage of the plurality of beams through the mirror towards the sample.

2. The device of claim 1, wherein each aperture of the mirror corresponds to a respective one or more beams of the plurality of beams.

3. The device of claim 1, wherein the scintillators are arranged in an array.

4. The device of claim 3, wherein the array is orthogonal to the path of the plurality of beams.

5. The device of claim 3, wherein the array comprises a two-dimensional pattern.

6. The device of claim 1, wherein the scintillators are positioned up-beam of at least one of the electrodes of the objective lens array.

7. The device of claim 1, wherein at least one of the electrodes of the objective lens array faces the sample.

8. The device of claim 1, wherein each scintillator surrounds an aperture configured to allow passage of a respective one or more beams of the plurality of beams.

9. The device of claim 1, wherein the scintillators are supported by one of the electrodes of the objective lens array.

10. The device of claim 1, wherein at least part of the light guiding arrangement and the objective lens array are structurally connected.

11. The device of claim 1, wherein the scintillators are positioned up-beam of the objective lens array.

12. The device of claim 1, wherein the scintillators are arranged in an array interleaved between paths of the beams.

13. The device of claim 1, wherein the scintillators are arranged in an array with each scintillator displaced relative to a path of a corresponding beam of the plurality of beams.

14. The device of claim 1, wherein the column further comprises a Wien filter arrangement configured to apply a deflection force to deflect signal particles toward the scintillators, wherein the Wien filter arrangement comprises a Wien filter array, each Wien filter element in the Wien filter array configured to act on signal particles generated by a different respective group of the beams.

15. The device of claim 14, wherein each group of beams comprises a row of beams, the row extending perpendicularly or obliquely to a direction of action of each Wien filter element in the Wien filter array on the signal particles.

16. A detector for a charged-particle optical device configured to project a plurality of beams of charged particles to a sample, the detector comprising:

a light sensor;

a plurality of scintillators configured to receive signal particles emitted from the sample responsive to projection of the beams of charged particles onto the sample and to generate light in response to the received signal particles; and a light guiding arrangement configured to guide the light generated by the scintillators to the light sensor for detection by the light sensor, the light guiding arrangement comprising a mirror defining a plurality of apertures to allow for passage of the plurality of beams through the mirror towards the sample.

17. The detector of claim 16, wherein the scintillators are arranged in an array.

18. The detector of claim 17, wherein the array is orthogonal to a path of the plurality of beams.

19. The detector of claim 17, wherein the array comprises a two-dimensional pattern.

20. The detector of claim 16, wherein each scintillator surrounds an aperture configured to allow passage of a respective one or more beams of the plurality of beams.

* * * * *